(12) United States Patent
Kawada et al.

(10) Patent No.: US 6,703,792 B2
(45) Date of Patent: *Mar. 9, 2004

(54) MODULE FOR MOUNTING DRIVER IC

(75) Inventors: Toyoshi Kawada, Kawasaki (JP); Masami Aoki, Tokyo (JP); Haruo Koizumi, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/511,353

(22) Filed: Feb. 23, 2000

(65) Prior Publication Data

US 2003/0076049 A1 Apr. 24, 2003

(30) Foreign Application Priority Data

Feb. 25, 1999 (JP) .......................................... 11-049121

(51) Int. Cl.[7] ................................................ G09G 3/10
(52) U.S. Cl. .................... 315/169.4; 345/205; 361/764; 257/784
(58) Field of Search ........................... 315/169.4, 169.2, 315/169.1; 345/205, 206, 211, 214; 361/764; 257/784, 786

(56) References Cited

U.S. PATENT DOCUMENTS

| | | | | |
|---|---|---|---|---|
| 4,613,855 A | * | 9/1986 | Person et al. ................ 340/718 |
| 5,585,666 A | * | 12/1996 | Imamura ..................... 257/666 |
| 5,893,623 A | * | 4/1999 | Muramatsu .................. 349/152 |
| 5,995,088 A | * | 11/1999 | Stoller ........................ 345/205 |
| 6,160,605 A | * | 12/2000 | Murayama et al. .......... 349/152 |
| 6,169,530 B1 | * | 1/2001 | Mori et al. .................... 345/93 |
| 6,240,567 B1 | * | 3/2001 | Imamura ..................... 257/786 |

FOREIGN PATENT DOCUMENTS

| | | |
|---|---|---|
| JP | 4-3025 | 1/1992 |
| JP | 5-198603 | 8/1993 |
| JP | 8-286202 | 11/1996 |
| JP | 9-160525 | 6/1997 |
| JP | 2803699 | 7/1998 |
| JP | 10-187098 | 7/1998 |
| JP | 10-215038 | 8/1998 |

\* cited by examiner

*Primary Examiner*—Don Wong
*Assistant Examiner*—Thuy Vinh Tran
(74) *Attorney, Agent, or Firm*—Staas & Halsey LLP

(57) ABSTRACT

A module, for mounting a driver IC constituting a drive circuit of a display apparatus using a flat display panel, is disclosed, which includes a driver IC chip for driving the display electrodes of the flat display panel and a wiring board electrically connected with the driver IC chip. A module for mounting the driver IC having this configuration comprises a first wiring unit formed with a drive power source system wiring for supplying a power source voltage, which is input to the driver IC chip, for driving the flat display panel through the driver IC chip; a second wiring unit formed with a control system wiring for supplying various signals, which are input to the driver IC chip, for controlling the driver IC chip; and a third wiring unit formed with an output terminal wiring taken out from the driver IC chip and connecting to the display electrodes of the flat display panel.

53 Claims, 25 Drawing Sheets

PRIOR ART

PRIOR ART

PRIOR ART (COB CONFIGURATION)
PRIOR ART (COM CONFIGURATION)
PRIOR ART

Fig.19
(A) 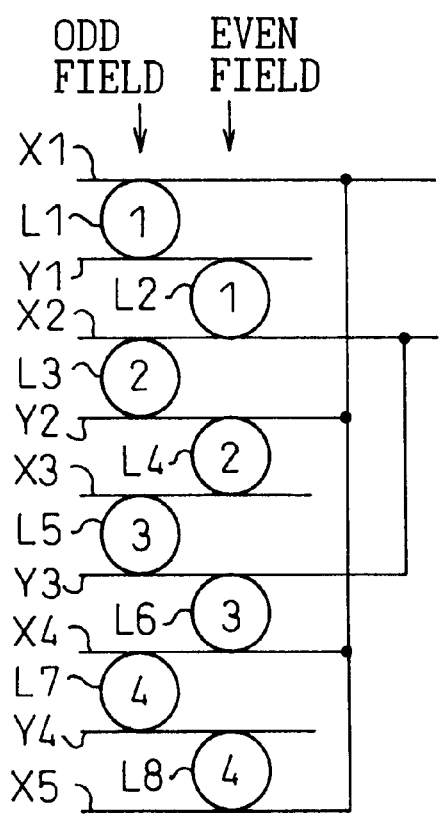
(B) 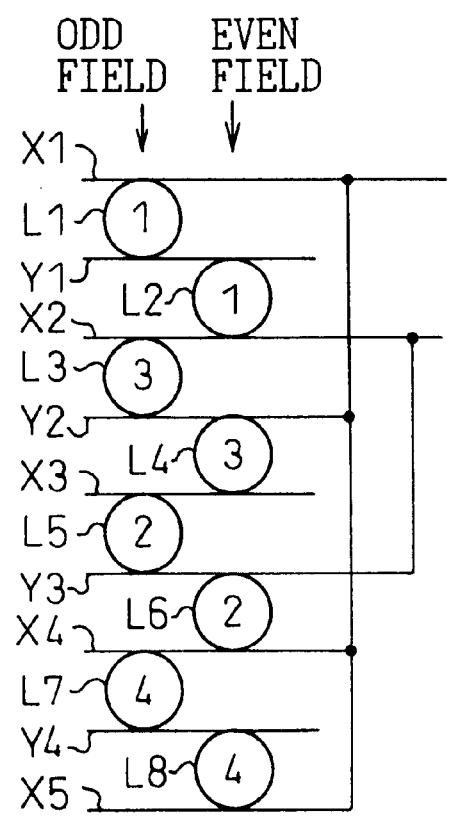

MODULE FOR MOUNTING DRIVER IC

BACKGROUND OF THE INVENTION

1. Field of the Invention

The present invention relates to a module for mounting a driver IC (integrated circuit) constituting a drive circuit for driving display electrodes of a display device using a flat display panel and, in particular, relates to a new structure of the module for mounting the driver IC capable of supplying a stable large current having a predetermined peak to a display panel of the display device during operation of the display device.

The module for mounting the driver IC of this structure is typically applied to a display unit having a large-capacity flat display panel configured with a large-number of display cells having capacitive load characteristics, such as a plasma display panel (the whole of the plasma display unit including a plasma display panel and a peripheral circuit is generally referred to as "PDP"), an EL (electroluminescence) panel or a large-sized LCD (liquid crystal display) panel.

2. Description of the Related Art

Remarkable developments and progress in the flat display panels have been made recently. In particular, an AC (alternating current) plasma display panel of three-electrode surface discharge type, which is easy to increase the screen size and to display in color, is applied to a field of a large-capacity flat display panel, e.g, a large-sized color television, and has been put into practical use.

In this type of AC plasma display panel, voltage pulses are applied to two kinds of electrodes for sustaining the discharge alternately to sustain the discharge for luminous display. A period in which the discharge (lighting) occurs, due to the application of each of the voltage pulses, lasts several $\mu s$ (microseconds) after the application of each voltage pulse. Ions constituting positive charges generated by the discharge are accumulated over an insulating layer on the electrode which the negative voltage pulse is applied to. In a similar way, electrons constituting negative charges are accumulated over an insulating layer on the electrode which the positive voltage pulse is applied to.

Here, it is assumed that wall charges are generated by discharging with the voltage pulse (write pulse) of a high voltage (write voltage) at first and, subsequently, the voltage pulse having a voltage (sustain voltage) lower than the write pulse and also having the opposite polarity (sustain voltage pulse or sustain pulse). The voltage generated due to the wall charges which have been previously accumulated are superimposed on the sustain voltage to generate a sufficiently large voltage with respect to the discharge space. When such a large voltage exceeds the threshold value of the discharge voltage necessary for starting the discharge, the discharge is started. In other words, the cells in which write discharge has once occurred by means of the write pulse to generate the wall charges, subsequently continue to discharge by applying the sustain pulses to the two kinds of sustain discharge electrodes alternately with opposite polarities. This phenomenon is generally referred to as "memory effect" or "memory drive". The AC plasma display panel is intended to realize the display utilizing this memory effect.

AC plasma display panels are classified into two types. One type is a two-electrode type of AC plasma display panel for carrying out the selective discharge (addressing discharge) and the sustain discharge with two kinds of electrodes. The other type is a three-electrode type of AC plasma display panel for carrying out the addressing discharge by utilizing a third kind of electrode, in addition to the sustain discharge with two kinds of electrodes. In the color plasma display panel for multi-gradation display, a phosphor formed in the cells is excited by ultraviolet rays generated due to the discharge. However, this phosphor has the disadvantage that it is relatively fragile against the bombardment of ions constituting the positive charges generated at the same time due to the discharge. The two-electrode type of the AC plasma display panel is configured so that ions directly collide with the phosphor, and therefore, the life of the phosphor is likely to become shortened. In order to avoid this disadvantage, the three-electrode type of AC plasma display panel, utilizing the surface discharge (generally referred to as "AC plasma display panel of surface discharge type" or "surface discharge AC plasma display panel"), is generally used.

In order to facilitate understanding of the problems concerning the conventional module for mounting the driver IC, an example of the conventional configuration of the module for mounting the driver IC applied to an ordinary plasma display panel will be explained, with reference to FIGS. 1 to 10 described later in "BRIEF DESCRIPTION OF THE DRAWINGS".

A plan view showing a simplified model configuration of an ordinary AC plasma display panel of surface discharge type, is illustrated in FIG. 1. Further, a sectional view taken along the horizontal direction in FIG. 1, schematically showing the configuration of an ordinary AC plasma display panel of surface discharge type, is illustrated in FIG. 2.

As shown in FIGS. 1 and 2, a display panel 300 constituting an ordinary AC plasma display panel of surface discharge type is configured with two glass substrates 310 including a front glass substrate 310 and a rear glass substrate 320. The front glass substrate 310 has arranged thereon sustain electrodes (X1, X2, X3, . . . , Xj, . . . , Xn, where j is an arbitrary positive integer) constituted by a bus electrode and a transparent electrode and scanning electrodes (Y1, Y2, . . . , Yj, . . . , Yn).

Addressing electrodes (A1, A2, Ai, . . . , Am, where and i and m are arbitrary positive integers) are arranged in a form crossing at right angles to the sustain electrodes on the rear glass substrate 320. These three kinds of electrodes form each display cell 340 for generating the discharge light emission in a regions defined by the scanning electrode and the sustain electrode of the same number crossing at right angles to the addressing electrode. The sustain electrode (Xj), the scanning electrode (Yj) and the addressing electrode (such as Ai−1, Ai and Ai+1) are covered with a dielectric layer 350 for holding the wall charges. Further, a partition wall 330 for isolating the display cells from each other and a phosphor 360 for emitting light by means of ultraviolet rays generated due to the discharge are formed on the dielectric layer on the addressing electrode.

A block diagram showing the essential parts of the drive circuit for the AC plasma display panel of surface discharge type shown in FIGS. 1 and 2, is illustrated in FIG. 3.

As shown in FIG. 3, the surface discharge AC plasma display panel drive unit for activating the display panel 300 includes a control circuit 370 for generating a control signal for controlling the drive circuit of the AC plasma display panel of surface discharge type by interface signals (for example, a clock signal CLK, a data signal DATA, a vertical synchronous signal VSYNC and a horizontal synchronous signal HSYNC) input from an external source; and a sustain electrode circuit, a scanning electrode drive circuit and an addressing electrode drive circuit for driving the display electrodes of the display panel by the particular control signal. The sustain electrode drive circuit, the scanning electrode drive circuit and the addressing electrode drive circuit make up the essential parts of the drive circuit for the AC plasma display panel of a surface discharge type.

The sustain electrode drive circuit includes an X common driver 390 for generating the sustain pulse, the scanning electrode drive circuit includes a Y common driver 391 for generating the sustain pulse and a scanning circuit 392 for driving and scanning each scanning electrode independently. The addressing electrode drive circuit, on the other hand, includes an addressing circuit 380 for applying an addressing voltage pulse corresponding to the display data to each address electrode. The data signal DATA indicating the display data to be displayed on the display panel is temporarily stored in a frame memory 372 of a display data control unit 371 in the control circuit, and then supplied to the addressing circuit 380 in synchronism with the clock signal CLK. Further, the scanning circuit 392 is controlled by a scanning driver control unit 373 in the control circuit based on the vertical synchronous signal VSYNC. Furthermore, the X common driver 390 and the Y common driver 391 are controlled by a common driver control unit 374 in the control circuit based on the horizontal synchronous signal HSYNC.

A timing chart for explaining the operation of the drive circuit of FIG. 3, is illustrated in FIG. 4. This timing chart represents the essential points of a drive voltage waveform for image display on the display panel applied to each electrode in the operation of the drive circuit of FIG. 3, and primarily includes a write discharge period for the whole surface, an erase discharge period for the whole surface, an addressing discharge period and a sustain discharge period.

Among these periods, the drive period directly associated with the image display includes the addressing discharge period and the sustain discharge period. By selecting the pixels displayed during the addressing discharge period and emitting light from the selected pixels in the next sustain discharge period, a display of a predetermined brightness is accomplished.

During the addressing discharge period, the voltage of an intermediate voltage level −Vmy is applied to all the scanning electrodes (Y1 to Yn) at a time, after which the voltage level is switched to and applied as the scanning voltage pulse (scan pulse) of −Vy. In synchronism with the application of the scanning voltage pulse to each scanning electrode, each addressing electrode (A1 to Am) is impressed with the addressing voltage pulse of voltage level Va thereby to select the pixels on each scanning line.

In the next sustain discharge period, all the scanning electrodes (Y1 to Yn) and the X electrodes (X1 to Xn) are impressed alternately with the sustain voltage pulse of common voltage level +Vs, so that the previously selected pixels emit light. By this continuous application, the display of predetermined brightness is accomplished. Also, the density gradation can also be displayed by controlling the number of times in which light is emitted in combination with the series of basic operations of the drive voltage waveforms.

The write discharge period for the whole surface is for activating each display cell and holding a uniform display characteristic by applying a write voltage pulse of level Vwx to all the display cells on the whole panel surface, and is inserted at predetermined time intervals.

The erase discharge period for the whole surface, on the other hand, is for erasing the previous contents of display by applying a slope erase pulse of a peak voltage level Vey as an erase voltage pulse to all the display cells over the whole panel surface before starting a new addressing discharge operation and a new sustain discharge operation for image display.

A plan view showing the connection structure between the module for mounting the driver IC on the scanning electrode and the panel electrode of FIG. 4, is illustrated in FIG. 5. Further, a block diagram showing a circuit configuration of the module for mounting the driver IC of FIG. 5, is illustrated in FIG. 5. Further, a circuit diagram showing a circuit configuration of each driver IC chip in the module for mounting the driver IC, is illustrated in FIG. 7. FIGS. 5 to 7 show the manner in which the module for mounting the driver IC on the scanning electrode of the AC plasma display panel of surface discharge type including the three electrodes described above, is connected to the display panel, and also show a concrete circuit configuration of the module for mounting the driver IC.

The module for mounting the driver IC on the scanning electrode shown in FIGS. 5 and 6 represents a configuration example in which the display panel 300 has 480 scanning electrodes (Y1 to Y480). The driver IC chips 400 connected to these scanning electrodes each normally have an output of 64 bits, and therefore a total of eight driver chips are used. According to an embodiment of the present invention described later, the driver IC chips are distributed between two modules 401, 402 for mounting the driver IC, each of which includes four driver IC chips M1 to M4 mounted thereon. The input unit of these modules for mounting the driver IC includes input connectors 461, 462, respectively, while the output unit thereof has output terminals 471, 472 for connecting the scanning electrodes.

A concrete circuit in each driver IC chip is illustrated in FIG. 7. This circuit has an output circuit unit for outputting scanning electrode drive signals OUT1 to OUT64 corresponding to 64 bits.

These output circuit units are connected with a ground wiring GND for supplying the ground potential and a high power voltage power source wiring VH for supplying a high power source voltage through P-channel field effect transistors (hereinafter referred to as the P-channel FET) 406-1 to 406-64 and N-channel field effect transistors (hereinafter referred to as the N-channel FET) 407-1 to 407-64 of push-pull type in the last stage of the output portion. Further, diodes 408-1 to 408-64 are connected in opposite polarities between the source and the drain of the P-channel FETs 406-1 to 406-64, respectively. The cathodes of these diodes 408-1 to 408-64 are all connected to the high voltage power source wiring VH and operate so that the drive current is absorbed into the high voltage power source wiring. On the other hand, diodes 409-1 to 409-64 are connected in opposite polarities between the drain and the source of the N-channel FETs 407-1 to 407-64, respectively. The anodes of all the diodes 409-1 to 409-64 are also connected to the ground wiring GND, and operate so that the drive current flows into the output side from the ground wiring GND.

It should be noted that the ground wiring GND shown in FIGS. 6 and 7 is defined merely as the relative ground wiring formed in the two modules 401, 402 for mounting the driver IC, and does not always have an absolute ground potential. Conversely, since the voltage pulse for driving the display panel 300 is supplied from the Y common driver 391 to the ground wiring GND, the potential of the ground wiring GND varies greatly with respect to time (i.e., floating ground wiring GND).

Further, the circuit in the driver IC chip of FIG. 7 includes a logic circuit for controlling the P-channel FETS and the N-channel FETS of the push-pull type described above. This logic circuit includes N-channel FETs 405-1 to 405-64 for controlling the on/off operation of the P-channel FETs 406-1 to 406-64, respectively, through a pair of resistors R1-1 to R1-64, R2-1 to R2-64, respectively, inverters 404-1 to 404-64 for controlling the on/off operation of the N-channel FETs 407-1 to 407-64, and NAND gates 403-1 to 403-64 for applying a control signal to the N-channel FETs 405-1 to 405-64 and the inverters 404-1 to 404-64 based on a strobe signal STB. These circuits are operated by a low voltage power source VCC for logic application.

Further, the internal circuit of the driver IC chip of FIG. 7 includes a 64-bit shift register 411 for selecting the 64-bit output circuit unit, and a latch circuit 412 for temporarily holding the control signal output from the 64-bit shift register and transmitting it to the NAND gates 403-1 to 403-64. The control signal is configured with a clock signal CLK and a data signal DATA input to the 64-bit shift register 411, a latch signal LATCH input to the 64-bit latch circuit 412 and a strobe signal STB for controlling the logic circuits.

A sectional view showing the structure of a first example of the conventional module for mounting the driver IC, is illustrated in FIG. 8. The module for mounting the driver IC of this configuration is generally referred to as "COB (chip on board) structure".

The module for mounting the driver IC shown in FIG. 8 is constructed so that a driver IC chip 400 is mounted on a printed circuit board 430 of a rigid type. Further, in the module for mounting the IC driver described above, the pad terminal 410 on the driver IC chip is connected, by wire bonding, to a connecting terminal connected to input signal and power supply line wiring patterns 440 formed in each layer of the printed circuit board 430 of multilayer wiring type. Further, the input unit of the module for mounting the driver IC described above has an input connector 461 (or 462). This input connector 461 is connected with an input terminal wiring pattern 445 formed in the upper layer of the printed circuit board 430 of multilayer wiring type on the one hand and with the input signal and power supply line wiring patterns 440 of other layers of the printed circuit board 430, through conduction through holes 446, on the other hand.

Further, the voltage from the high voltage power source, the voltage from the low voltage power source, the ground potential and various signals are supplied from the input connector 461 and the input signal line and the power supply line wiring patterns 440 to the driver IC chip 400, through the corresponding pad terminal 410 on the driver IC chip. On the other hand, the output unit of the module for mounting the driver IC described above includes an output terminal connection pattern 450 formed in the upper layer of the printed circuit board 430. This connecting terminal 420 (i.e., the output terminal connection pattern 450) and the pad terminal 410 for outputting the driver signal from the driver IC chip 400 are directly connected and wired, by means of wire bonding, to each other.

Furthermore, the output terminal connection pattern 450 is led out to the end surface of the printed circuit board 430 and forms an output terminal connector. A flexible wiring board 480 having an output terminal wiring pattern 490 of the same shape as the output terminal connector is connected by thermal bonding to the output terminal connector, thereby forming one module for mounting the driver IC. A terminal which is to be connected to the display electrode of the display panel is arranged, at the forward end of the flexible wiring board 480. The output terminal unit 471 (or 472) having these terminals is used by being connected to the display electrode by means of a bonding technique such as thermocompression bonding.

A sectional view showing the structure of a second example of the conventional module for mounting the driver IC, is illustrated in FIG. 9. The module for mounting the driver IC having this configuration is generally referred to as "COM (chip on multiple board) structure".

Further, in the module for mounting the driver IC shown in FIG. 9, the printed board 510 of rigid type constituting a base is attached to the flexible wiring board board 530 formed with the output terminal wiring pattern 540 to a composite board 500 for the whole assembly.

Furthermore, in the module for mounting the driver IC shown in FIG. 9, the driver IC chip 400 is mounted on the printed circuit board 510 of a rigid type. Also, in the module for mounting the driver IC described above, the pad terminal 10 on the driver IC chip is connected and coupled, by wire bonding, with the connecting terminal connected to the input signal and power supply line wiring patterns 520 formed in each layer of the printed circuit board 510 of multilayer wiring type. Further, the input unit of the module for mounting the driver IC described above has an input connector 460, which is connected to the input terminal wiring pattern 515 formed in the upper layer of the printed circuit board 510 of multilayer wiring type on the one hand and to the input signal and power supply line wiring patterns 520 other layers of the printed circuit board 510, through the conduction through holes 516.

Further, the voltage from the high voltage power source, the voltage from the low voltage power source, the ground potential and various signals are supplied from the input connector 460 and the input signal and power supply line wiring patterns 520 to the driver IC chip 400, through the corresponding pad terminal 410 on the driver IC chip. On the other hand, the output unit of the module for mounting the driver IC described above has an output terminal wiring pattern 540 formed in the upper layer of the flexible wiring board 530 in the composite board. This output terminal wiring pattern 540 functions as a connecting terminal 420. This connecting terminal 420 (i.e., the output terminal wiring pattern 540) and the pad terminal 410 to which the drive signal is output from the driver IC chip 400 are directly connected and wired to each other by means of wire bonding.

Further, a terminal for connecting the display electrode of the display panel is arranged at the tip portion of the output terminal wiring pattern 540. These terminals are used by being connected to the display electrode by means of a bonding technique such as thermocompression bonding.

By the way, in both modules of FIGS. 8 and 9, a predetermined insulating film (such as a resist film or a cover lay film) is usually applied to the portion other than the terminals on the surface of each wiring board and the IC-mount, though not shown in FIGS. 8 and 9.

As shown in FIGS. 1 and 2, the internal structure of the display panel of an ordinary AC plasma display panel including the three-electrode surface discharge AC plasma display panel is such that all the display electrodes are covered with an insulating layer (dielectric layer), and a discharge gas is held in the space therebetween thereby to form a display cell. From the viewpoint of the drive circuit for driving these electrodes, therefore, the display electrodes have capacitive load characteristics. In the AC plasma display panel of surface discharge type shown in FIG. 2, for example, a capacitance Ca exists between the addressing electrodes and a capacitance Cg exists between the opposite electrodes, in addition to a capacitance Cs between the sustain electrode and the scanning electrode.

A timing chart showing the relationship between the drive voltage and the drive current of the scanning electrode of an ordinary AC plasma display panel of surface discharge type, is illustrated in FIG. 10.

The timing chart of FIG. 10 specifically shows the manner in which the drive current flowing in the scanning electrode changes upon application of the sustain pulse between the scanning electrode and the sustain electrode of the AC plasma display panel of surface discharge type. In synchronism with the timing of the rise of the sustain voltage pulse, the charge current and the gas discharge current flow in the form of peaks to the cell capacitance (i.e., the capacitance Cs between the sustain electrode and the scanning electrode and the capacitance Cg between the opposite electrodes), and in synchronism with the timing of the fall of the pulse, the discharge current flows in peaks from the cell capacitance. It should be noted that the capacitance Cs between the sustain electrode and the scanning electrode plays a primary role as the cell capacitance described above.

The peak current value of these drive currents, depending on the size of the display panel and the structure of the display cell, is generally 0.2 to 0.4 A per sustain electrode for the 42-inch display, and in terms of one driver IC chip on the scanning electrode having 64 outputs, the peak current is about 25 A at maximum. As a result, a maximum peak current larger than 90 A flows in one module for mounting the driver IC shown in FIG. 26.

Thus, the drive circuit is required to be constructed in such a manner as to be capable of supplying the above-mentioned peak current stably. First, it is necessary to use a driving element corresponding to such a peak current for the sustainer circuit including the X common driver and the Y common driver.

What is especially important is the configuration of the drive wiring system including the high voltage source wiring and the ground wiring leading from the sustainer circuit to the display panel. It is necessary to minimize the length of the wiring of the drive wiring system and to secure a sufficient wiring width and area for securing a low impedance line.

In the case in which the low impedance of the drive wiring system is difficult to realize, the peak current of the required magnitude cannot be supplied sufficiently as the drive voltage decreases, due to the impedance of the drive wiring system, even when the sustainer circuit has a sufficient driving capability. As a result, the luminous brightness of the discharge is reduced or the brightness variations occur so that the display quality of the plasma display panel deteriorates. At the same time, a sufficient margin of the drive voltage is difficult to secure, and display flickers or a luminous error (i.e., a luminous defect) occurs, thereby making the normal display operation impossible.

The number of display cells which are to be turned on among a plurality of the display cells arranged on each scanning line (display line) of the display panel is determined in accordance with the display data and generally varies from one scanning line to another. Specifically, each scanning line has a different load on the drive circuit. In the case in which the impedance of the drive wiring system is high, therefore, the value of the voltage drop of the drive voltage supplied to the display panel is varied from one display line to another. As a result, there occur some points in the display line in which the drive voltage of the required magnitude is not sufficiently supplied, thereby causing variations of the brightness on the display panel. In the case in which the drive voltage is increased in order to compensate for the drop of the drive voltage due to the impedance of the drive wiring system, on the other hand, the display cells which are not selected are liable to emit light, in addition to the display cells which are selected, and therefore the normal display operation becomes impossible.

Once the impedance of the ground wiring (or ground line) has increased, the flow of the high-frequency peak current constitutes noise in the drive circuit as a whole. As a result, a malfunction occurs in the drive circuit and the other circuits, thereby making it impossible to carry out the normal operation. Also, electromagnetic waves are radiated to have an adverse effect on the surrounding environment.

In such a drive wiring system, an especially disadvantageous point is the module for driving the display electrode connected directly to the display electrode of the display panel for mounting the driver IC connected directly to the display electrode of the display panel. It is important to attain a low impedance of the line of the drive wiring system for this portion of the module for mounting the driver IC.

The first example of the conventional module for mounting the driver IC as shown in FIG. 8 is configured so that various signals, including the clock signal, the latch signal and the strobe signal, are applied to the driver IC chip from the input connector 461 through the wiring pattern such as the input terminal wiring pattern 44 formed on the printed circuit board of a limited size. Therefore, a multilayer wiring is required using a multiplicity of conduction through holes in the printed circuit board. Specifically, the input wiring system utilizing the above-mentioned multilayer wiring uses a plurality of conduction through holes, and therefore, drive wiring systems including the high voltage power source wiring and the ground wiring or the like cross over the input wiring system for wiring. In the output wiring system for the module for mounting the driver IC, on the other hand, the pad terminal 410 and the output terminal for the output of the driver IC chip are connected with each other, through the output terminal connection pattern 450 on the printed circuit board. For this reason, the width and area of the drive wiring system are limited by an amount equivalent to the output terminal connection pattern and the conduction through holes. It is therefore difficult to realize a sufficiently low impedance for the drive wiring system.

On the other hand, in a second example of the conventional module for mounting the driver IC as shown in FIG. 9, a flexible wiring board 530 formed with the output terminal wiring pattern 540 of the output wiring system and the printed circuit board 500 are attached to each other. The output pad terminal of the driver IC chip 400 thus is directly connected to the output terminal wiring pattern by wire bonding. As a result, the output wiring system ceases to affect the drive wiring system. As compared with the first example described above, therefore, the width and area of the drive wiring system can be somewhat increased. Nevertheless, the input wiring system for the second example of the module for mounting the driver IC, similar to the first example, is wired by crossing the drive wiring system including the high voltage power source wiring and the ground wiring. Therefore, the width and area of the drive wiring system are still limited by an amount equivalent to the conduction through holes.

As a technique related to the conventional module for mounting the driver IC, Japanese Unexamined Patent Publication No. 10-215038 discloses a configuration of a composite circuit board including a flexible circuit board having a wiring pattern for drive circuitry for display in which an IC can be mounted with a power bus bar and a ground bus bar integratedly coupled on a part or the back of the flexible circuit board. In this composite circuit board, the drive wiring system including the power bus bar and the ground bus bar seem to be isolated from the input wiring system and the output wiring system, similar to the present invention. In this case, however, the wiring of the drive wiring system including the power bus bar and the ground bus bar is connected to the display drive IC, through the wiring pattern in the flexible circuit board, and therefore, is affected by the input wiring system and the output wiring system.

As another technique related to the conventional module for mounting the driver ID, Japanese Unexamined Patent Publication No. 5-198603 (registered as U.S. Pat. No. 2,803, 699 on Jul. 17, 1998) discloses an IC chip mounting structure comprising a first board for mounting the IC chip and a flexible second board, wherein a driving wiring system including a high voltage power source wiring and a ground wiring is formed on the first board and an output wiring system is formed on the second board. In this mounting structure, the input wiring system is also considered to be formed on the first substrate, and therefore, like the prior art shown in FIGS. 8 and 9, the input wiring system is wired by crossing the drive wiring system. As a result, the width and area of the drive wiring system are still limited.

SUMMARY OF THE INVENTION

The present invention has been developed in view of the above-mentioned problems, and the object thereof is to provide a module for mounting the driver IC which is capable of realizing a drive wiring system of low impedance easily by minimizing the impedance of the drive wiring system of the module for the driver IC used in a flat display panel.

In order to achieve the object described above, according to the present invention, there is provided a module for mounting the driver IC comprising a driver IC chip for driving the display electrode of a flat display panel, and a wiring board for electrically connecting the driver IC chip. The module for mounting the driver IC comprises at least a first wiring unit formed with a drive power source system wiring for supplying a power source voltage input to the driver IC chip for driving the flat display panel; a second wiring unit formed with a control system wiring for supplying signals input to the driver IC chip for controlling the driver IC chip; and a third wiring unit formed with an output terminal wiring taken out from the driver IC chip and connected to the display electrode of the flat display panel.

The module for mounting the driver IC according to the present invention is divided into a first wiring unit formed with a drive voltage system wiring (i.e., a drive wiring system) for supplying a power source voltage for driving the flat display panel, a second wiring unit formed with a control system wiring (i.e., an input wiring system) for supplying various signals for controlling the driver IC chip, and a third wiring unit formed with an output terminal wiring (i.e., an output wiring system). Therefore, the input wiring system can be wired without crossing the drive wiring system, and a sufficient wiring space can be secured in the drive wiring system of the module for mounting the driver IC. As a result, it is possible to realize a module for mounting the driver IC in which the line impedance of the drive wiring system of the display panel is suppressed to a relatively low value.

With this module configuration according to the present invention described above, a sufficient peak current can be supplied to the display panel, and therefore, a sufficient brightness and stable display characteristics can be obtained. Also, a sufficient operating margin is secured for a normal display operation.

Further, in a module for mounting the driver IC according to the present invention, a display unit can be realized in which noises are suppressed at the time of operation of the flat display panel and a stable control operation can be performed.

BRIEF DESCRIPTION OF THE DRAWINGS

The above object and features of the present invention will be more apparent from the following description of the preferred embodiments with reference to the accompanying drawings, wherein:

FIG. 19 is a diagram showing the sequence of display scan during the addressing period of the frame shown in FIG. 18;

DESCRIPTION OF THE PREFERRED EMBODIMENTS

Typical preferred embodiments of the present invention will be explained with reference to the accompanying drawings (FIGS. 11 to 31). These embodiments are preferably applied to a drive circuit for driving the scanning electrodes of a surface discharge AC plasma display panel having three kinds of electrodes.

Figure 11:
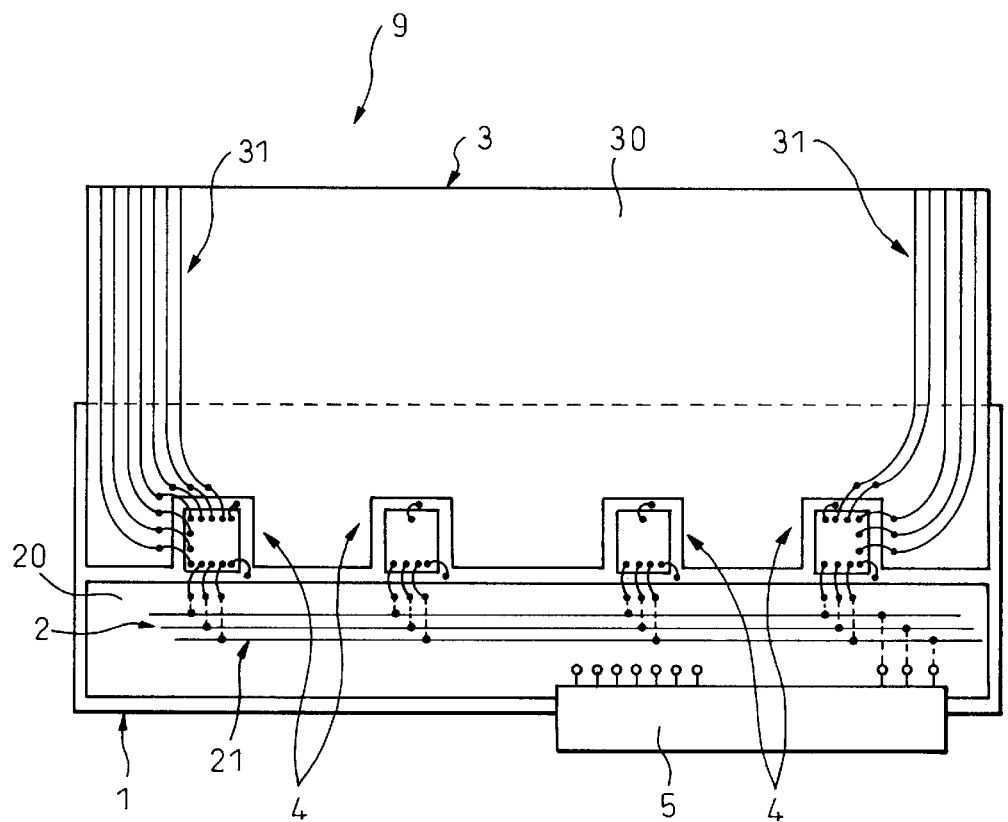
FIG. 11 is a plan view showing the structure of the module for mounting the driver IC according to a first embodiment of the present invention.
Figure 12:
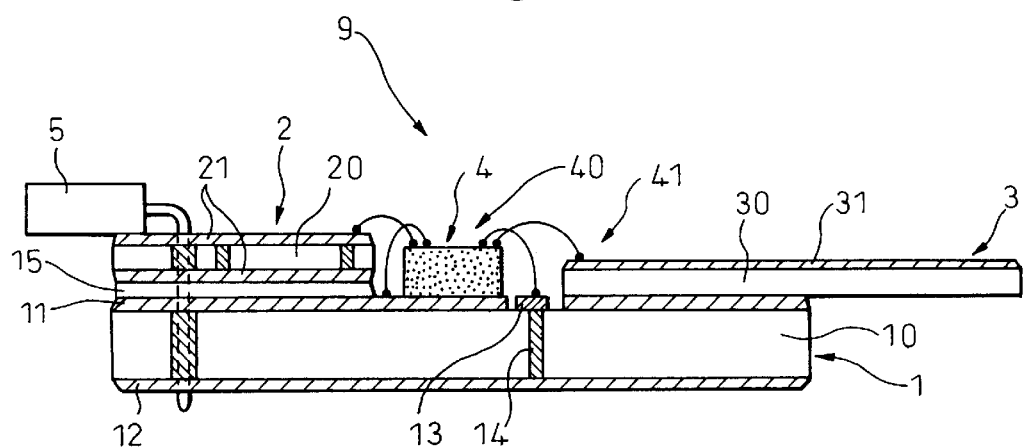
FIG. 12 is a sectional view showing the structure of the module for mounting the driver IC according to the first embodiment of the present invention.

FIG. 11 is a plan view showing the structure of a module for mounting the driver IC according to a first embodiment of the present invention. FIG. 12 is a sectional view showing the structure of a module for mounting the driver IC according to a first embodiment of the present invention.

The first embodiment shown in FIGS. 11 and 12 is an example in which a module for mounting a driver IC according to the present invention is applied to the module for mounting the driver IC for the scanning electrode of the surface discharge AC plasma display panel, and in which eight driver IC chips are distributed between two modules for mounting the driver IC. FIGS. 11 and 12, however, show the configuration of one module 9 for mounting the driver IC.

The mounting board used for the module for mounting the driver IC shown in FIGS. 11 and 12 is generally configured so that a base board 10 constituting the base is attached to a cross wiring board 20 including cross wiring patterns 21 formed with an input control signal wiring and a logic power wiring on the surface of the base board 10, to which a flexible wiring board 30 formed with an output terminal wiring pattern 31 is attached.

In this case, four driver IC chips are used and fixed in contact with the surface of the base board 10 of the body.

An input connector 5 for connecting an external board is arranged on the input unit of the module for mounting the driver IC according to the first embodiment described above. An input control signal line and a logic power line are connected to the cross wiring patterns 21 of the cross wiring board 20 from an external source through the input connector 5. On the other hand, the high voltage power source line and the ground line for supplying the voltage from the high voltage power source and the ground potential, respectively, are connected to the high voltage power source pattern 12 and the ground pattern 11, respectively, of the base board 10 through the input connector 5 from an external source.

The cross wiring board 20 requires wiring including the cross wiring patterns 21 crossed in such a manner that the input control signal line and the logic power line are input in parallel to the four driver IC chips 4, and is fabricated using a two-side printed board of two-layer wiring (or multilayer wiring).

Preferably, a printed board of a rigid type is used for this purpose. After fabricating the printed board of this structure, it is attached at a predetermined position on the surface of the base board 10 through the insulating plate 15. On the surface of the cross wiring board 20, there is also arranged a connecting terminal for connecting a bypass capacitor between the logic power supply line and the ground line in addition to the connecting terminal for connecting each wire to the driver IC chip. The cross wiring patterns 21 of the cross wiring board 20 correspond to the second wiring unit 2 formed with the control system wiring for controlling the driver IC chip.

The base board 10 is fabricated similarly using a two-side printed board of rigid type. The ground pattern 11 constituting the ground wiring layer is formed as a wider pattern with a sufficient width. For example, the ground pattern 11 is formed substantially over the whole front surface on which the driver IC chip is mounted. On the back side, on the other hand, a high voltage power source pattern 12 constituting a high voltage power source wiring layer is formed as a wider pattern with a sufficient width over the whole surface. A connecting terminal 13 for the high voltage power source layer to the driver IC chip is formed around the driver IC chip on the front surface of the base board 10. In this case, the high voltage power source pattern 12 is connected to the pad terminal 40 of the driver IC chip, through a conduction through hole 14 and the connecting terminal 13. The ground pattern 11 and the high voltage source pattern 12 of the base board 10 correspond to the first wiring unit 1 formed with the drive power source system wiring (i.e., the drive wiring system including the high voltage power source wiring and the ground wiring).

The output flexible wiring board 30 is fabricated of a single-layer wiring board having an insulating film made of a flexible polyimide material with a copper foil attached thereon in such a manner that a plurality of output terminal wiring pattern lines 31 are led in parallel from the driver IC chip to the output terminal unit. In this case, the single-layer wiring board, after being fabricated, is attached at a predetermined position on the surface of the base board 10. These output terminal wiring patterns 31 are also provided with a plurality of the connecting terminals 41 for connecting the output pad terminal 40 of the driver IC chip. The output terminal wiring patterns 31 of the flexible wiring board 30 correspond to the third wiring unit formed with the output terminal wiring.

After attaching the three types of boards described above at predetermined relative positions, the four driver IC chips are fixedly bonded at a predetermined position on the base board, after which each pad terminal of the driver IC chips is electrically connected to the corresponding connecting terminal of each board by means of wire bonding.

Upon completion of this electrical connection, a seal resin is coated on the driver IC chips and the area of the wire bonding for protection against humidity and the environment.

The input connector 5 and each board are connected to each other by means of soldering the connecting pin of the input connector 5 and the corresponding terminal of the wiring layer. Through this solder process, the whole module for mounting the driver IC is completed.

According to the first embodiment described above, the wiring system for the input signal of the input unit of the module for mounting the driver IC and the drive wiring system for the high voltage power source and the ground GND are installed on different wiring boards. Therefore, the wiring systems for the high voltage power source wiring and the ground wiring can be arbitrarily installed without being affected by the input wiring unlike in the prior art configuration. Thus, it is possible to secure the wiring area with a sufficient space.

As a result, a module for mounting the driver IC is realized in which the impedance of the lines of the driving system wiring including the high voltage power source wiring and the ground wiring can be kept low, thereby making possible a stable display operation of the display panel.

Figure 13:
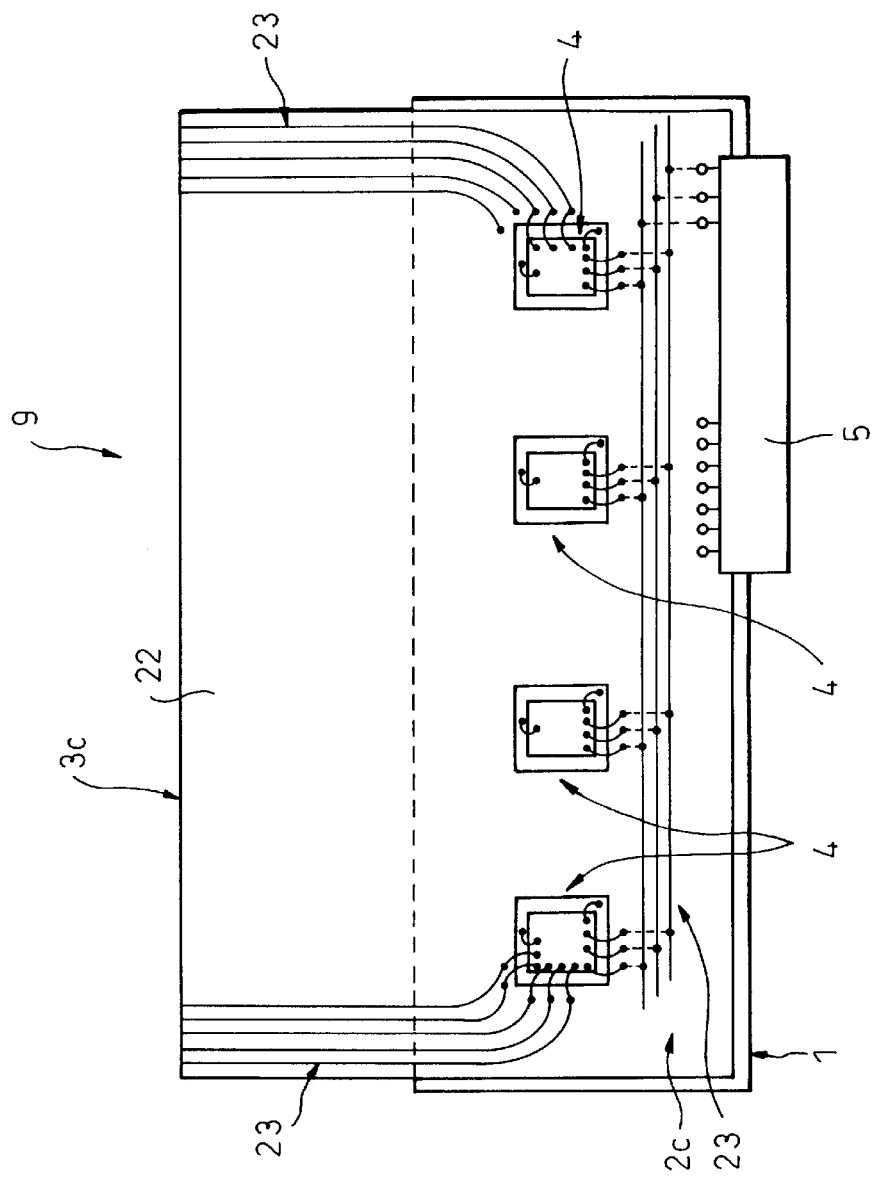
FIG. 13 is a plan view showing the structure of the module for mounting the driver IC according to a second embodiment of the present invention.
Figure 14:
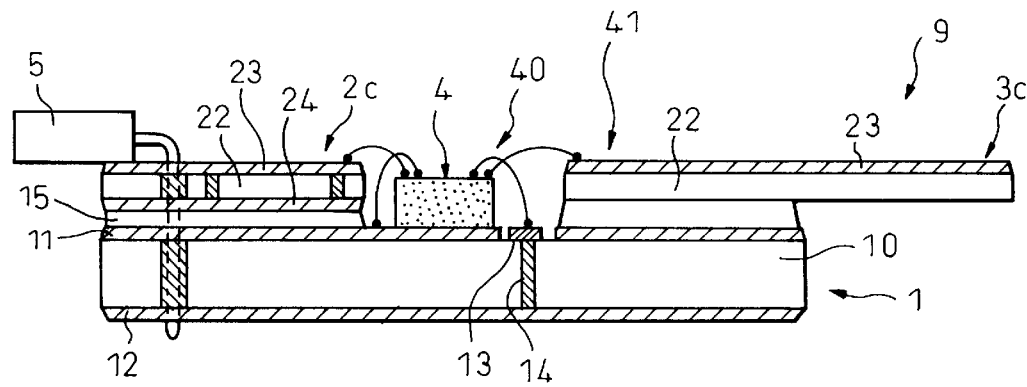
FIG. 14 is a sectional view showing the structure of the module for mounting the driver IC according to the second embodiment of the present invention.

FIG. 13 is a plan view showing the structure of a module for mounting the driver IC according to a second embodiment of the present invention; and FIG. 14 is a sectional view of the structure of a module for mounting the driver IC according to the second embodiment. In the description that follows, the component elements similar to those described above are designated by the same reference numerals, respectively.

The second embodiment shown in FIGS. 13 and 14 represents an application to a module for mounting the driver IC of a surface discharge AC plasma display panel on the scanning electrode as in the first embodiment. Eight driver IC chips are mounted by being distributed between two modules for mounting the driver IC. FIGS. 13 and 14 show the configuration of one module 9 for mounting the driver IC.

The configuration of the base board 10 shown in FIGS. 13 and 14 is substantially identical to the one used in the first embodiment and will not be described below.

The great difference of the configuration of the second embodiment from that of the first embodiment lies in that the cross wiring board of the input unit and the flexible wiring board of the output unit of the module for mounting the driver IC are constructed by the same single board. Specifically, according to the second embodiment, the two boards including the cross wiring board of the input unit and the flexible wiring board of the output unit are formed of a common flexible wiring board 22.

More specifically, two layers of copper foil are attached to each other with an insulating film of polyimide material or the like held therebetween, thereby producing a two-side wiring pattern (upper side wiring pattern 23 and a lower side wiring pattern 24) formed as a two-side wiring board. Using this two-side wiring board, the portion corresponding to the cross wiring board of the input unit in the first embodiment is formed while, at the same time, forming a plurality of output terminal wiring patterns of the output unit on one side of the two-side wiring pattern. According to the second embodiment, the output terminal wiring pattern is formed of the upper side copper foil unit (the upper side wiring pattern 23, for example) in FIG. 14. The upper side pattern 23 and the lower side pattern 24 formed on the common flexible wiring board 22 of the input unit make up a common cross wiring unit 2c, while the upper side wiring pattern 23 formed on the common flexible wiring board 22 of the output unit constitutes the output terminal unit 3c.

As described above, a single common flexible wiring board 22 formed with the wiring patterns of the input and output units is attached at a predetermined position on the base board 10 with an insulating plate 15 therebetween, thereby completing the fabrication of the board portion of the module for mounting the driver IC.

Subsequently, four driver IC chips are fixedly bonded at a predetermined position on the base board 10. At the same time, each pad terminal of the driver IC chip and each terminal of the base board 10 and the common flexible wiring board 22 are connected with each other by means of wire bonding. Specifically, the pad terminal for the input control signal and the pad terminal for the logic power supply of the driver IC chip are electrically connected by means of wire bonding to the corresponding terminal on the common flexible board formed with a cross wiring pattern. On the other hand, the output pad terminal of the driver IC chip is also electrically connected to the corresponding terminal of the output terminal wiring pattern on the common flexible board, by means of wire bonding. Further, the high source voltage pad terminal and the ground terminal of the driver IC chip are electrically connected to the corresponding terminals on the base board, by means of wire bonding.

Furthermore, the driver IC chip and the area of the wire bonding are sealed, and the input connector 5 is connected by soldering, thus completing the assembly of the whole, .module for mounting the driver IC.

The feature of the second embodiment described above, unlike the first embodiment, is that the cross wiring pattern and the output terminal wiring pattern are formed of a single common flexible board, and therefore the whole structure can be realized in a relatively simplified form with the smaller number of components and processing steps while reducing the cost of fabricating the module for mounting the driver IC as a whole.

The present applicant has previously developed a drive system and a circuit system capable of adding a new display function to the conventional surface discharge AC plasma display panel as described in Japanese Unexamined Patent Publication No. 9-160525. This drive system is intended for the surface discharge AC plasma display panel of interlace type and is preferably referred to as "ALIS (alternate lighting of surfaces) drive system".

Figure 1:
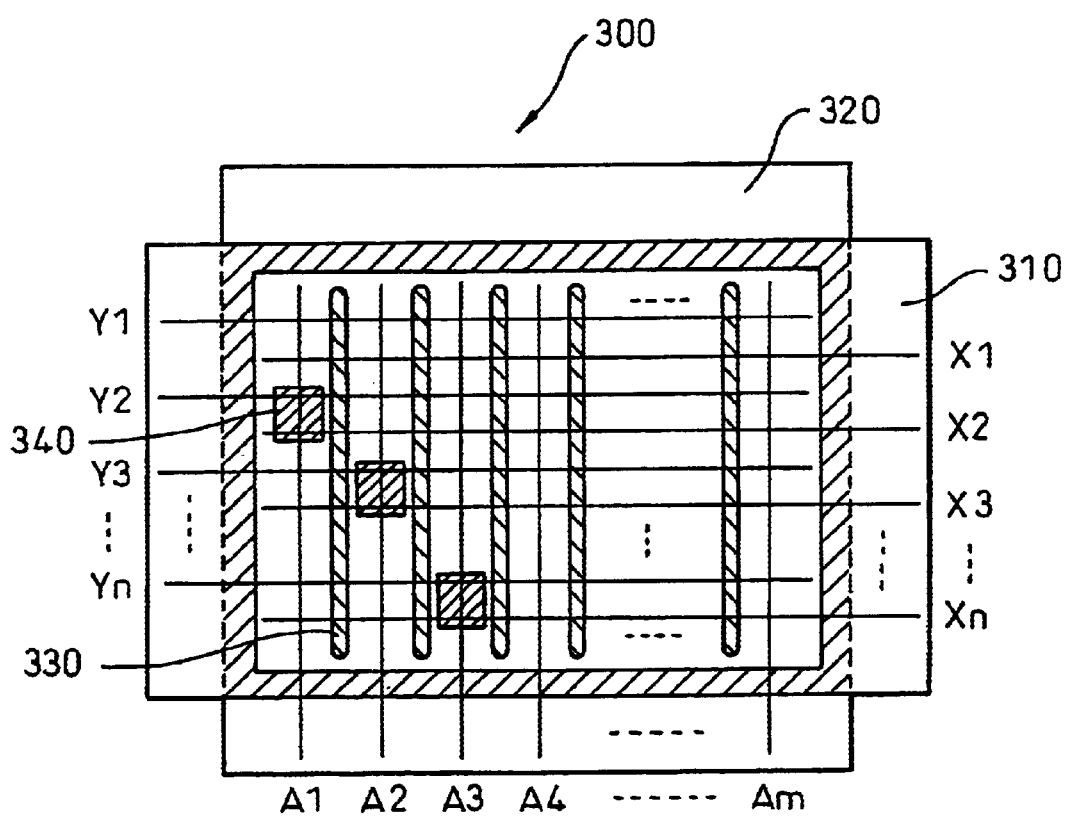
FIG. 1 is a plan view showing a model configuration of an ordinary surface discharge AC plasma display panel.
Figure 2:
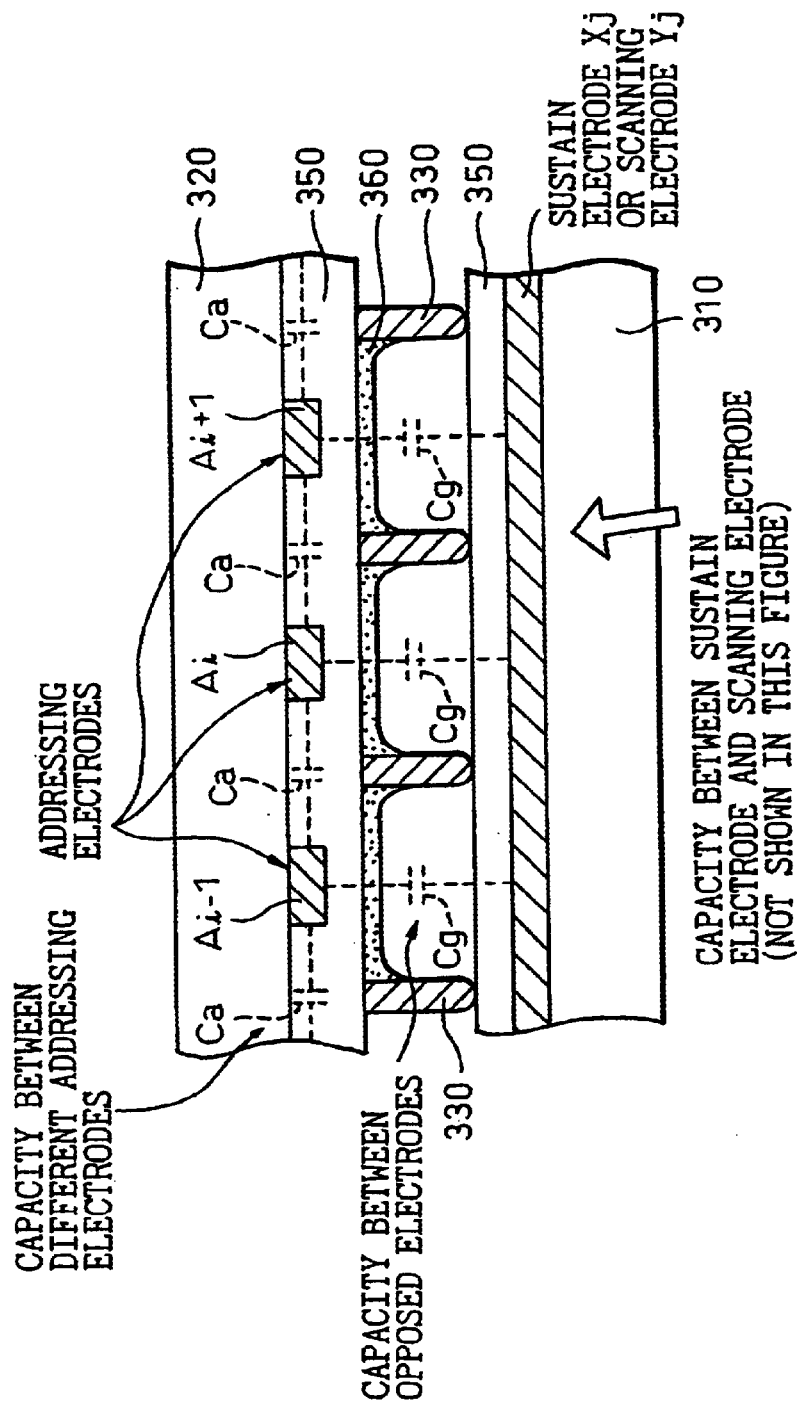
FIG. 2 is a sectional view showing a model configuration of an ordinary surface discharge AC plasma display panel.
Figure 3:
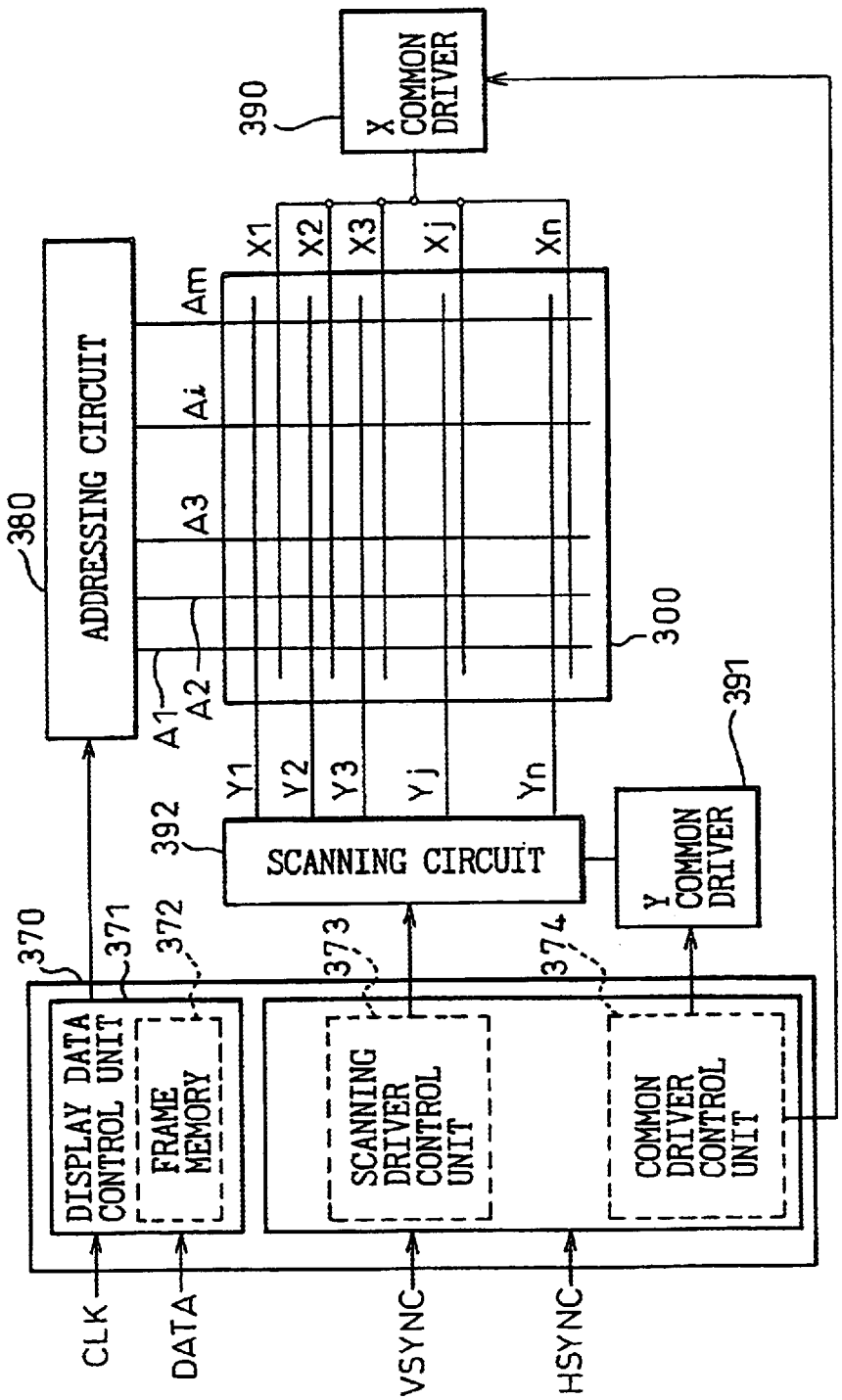
FIG. 3 is a sectional view showing the essential parts of a drive circuit of an ordinary surface discharge AC plasma display panel.
Figure 4:
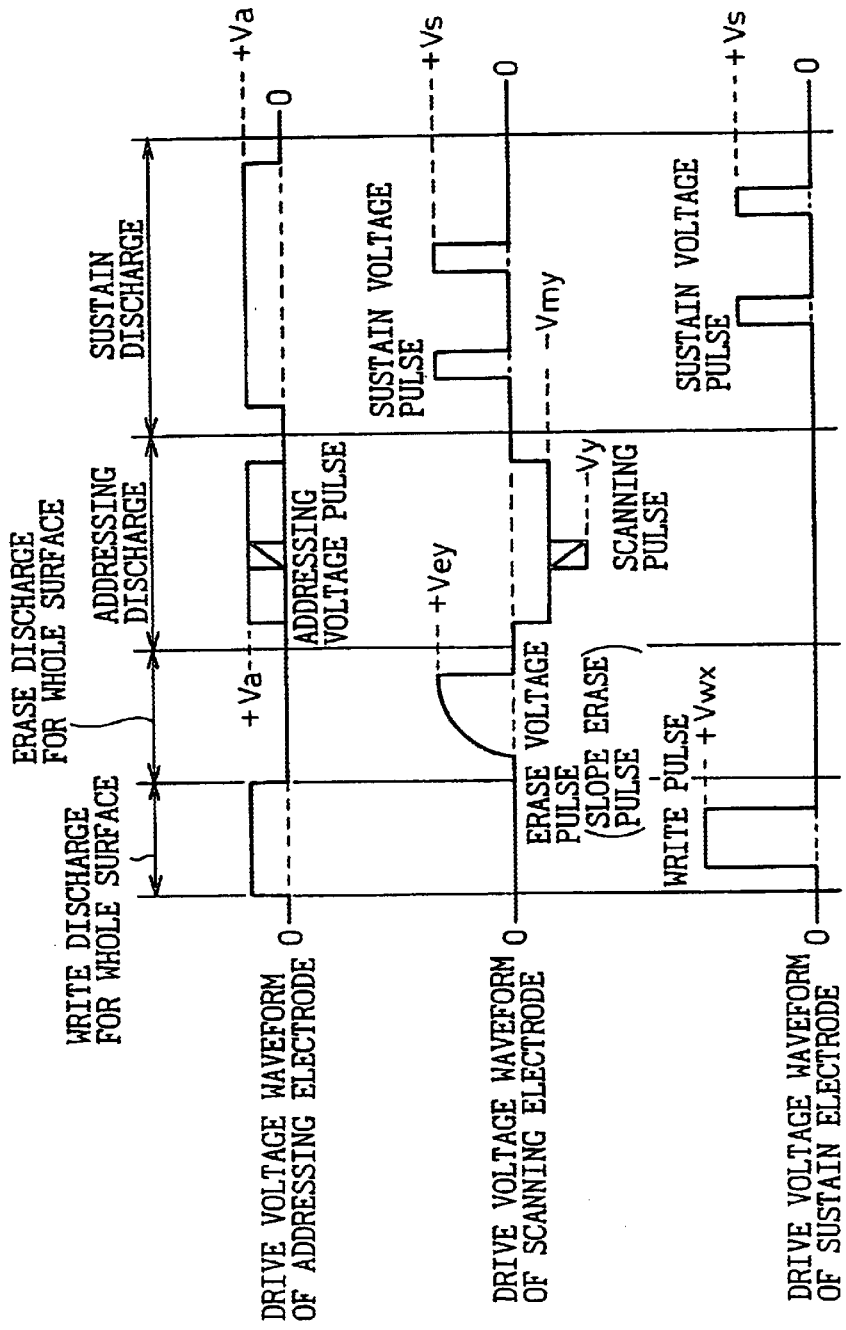
FIG. 4 is a timing chart for explaining the operation of the drive circuit shown in FIG. 3.
Figure 5:
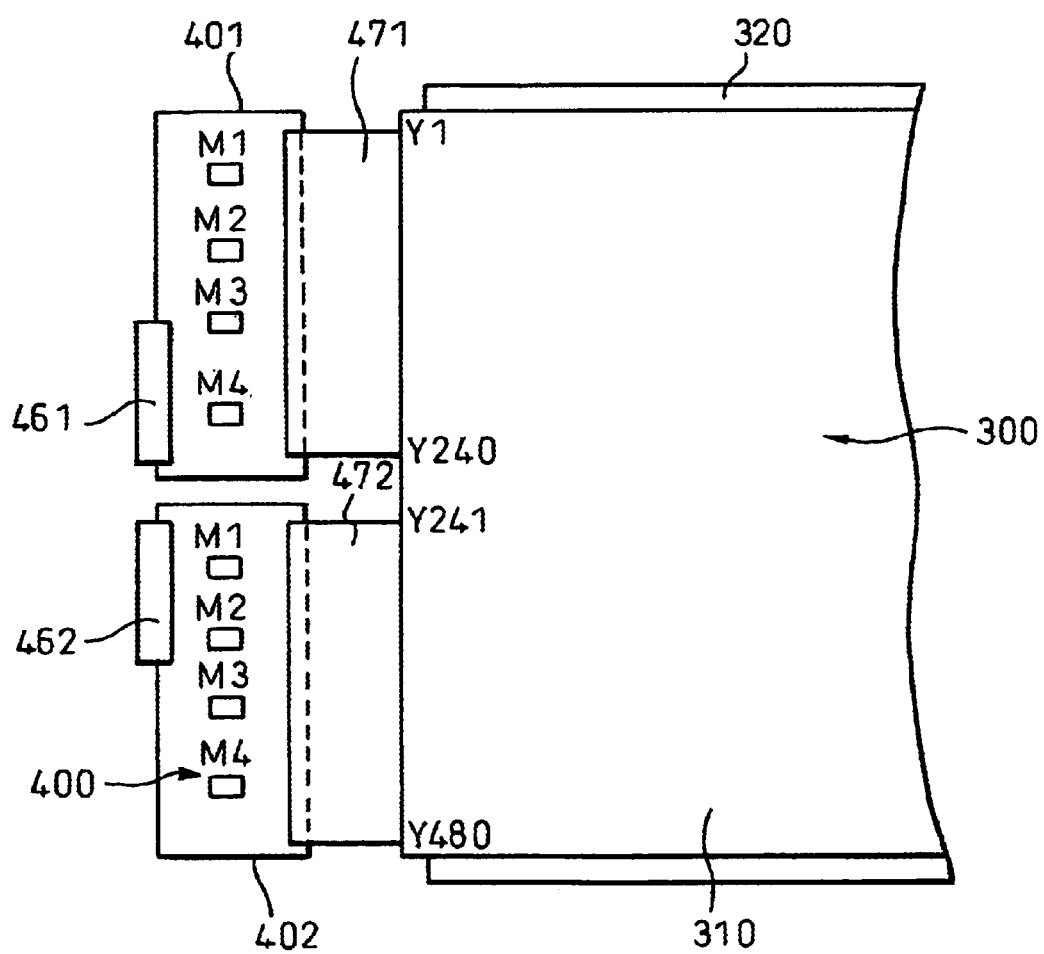
FIG. 5 is a plan view showing the connection structure between the module for mounting the driver IC on the scanning electrode and the panel electrode.
Figure 6:
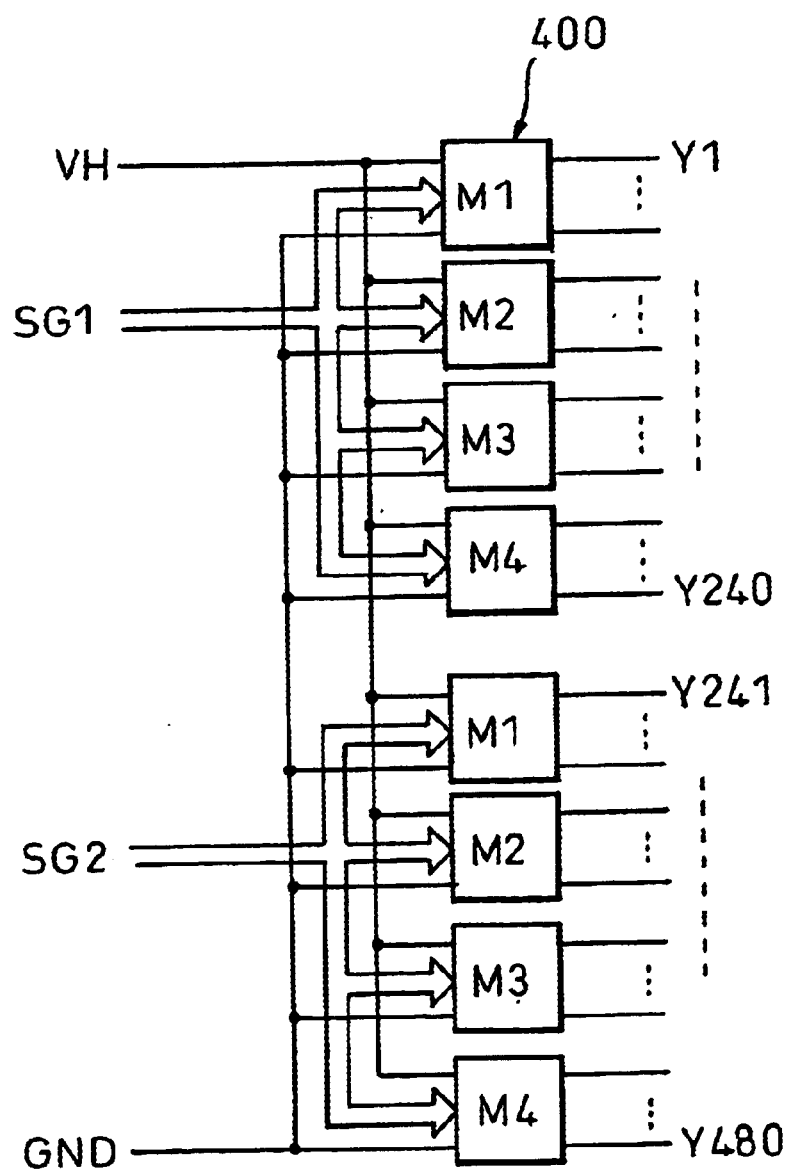
FIG. 6 is a block diagram showing a circuit configuration of the module for mounting the driver IC of FIG. 5.
Figure 7:
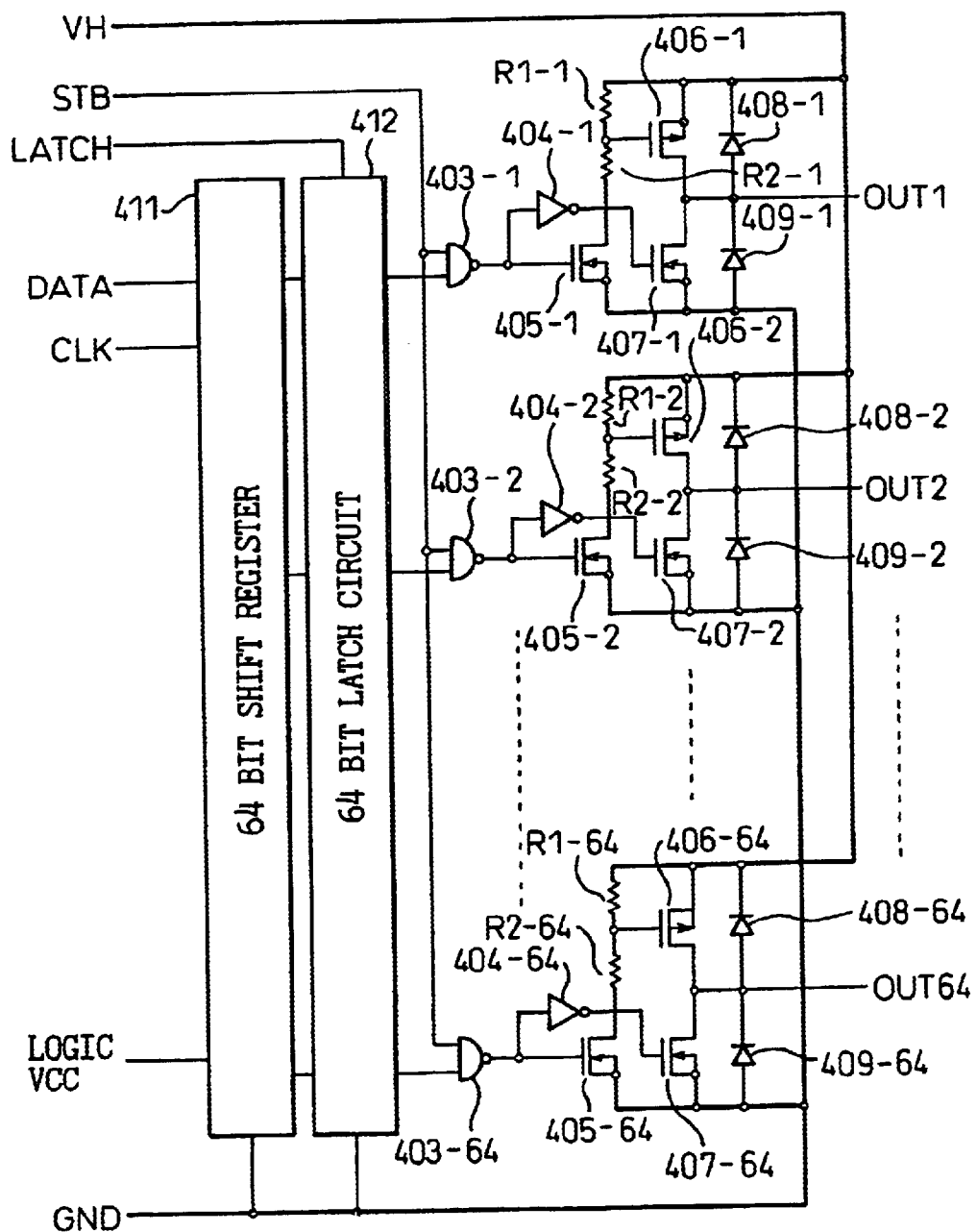
FIG. 7 is a circuit diagram showing a circuit configuration of each driver IC chip in the module for mounting the driver IC shown in FIG. 5.
Figure 8:
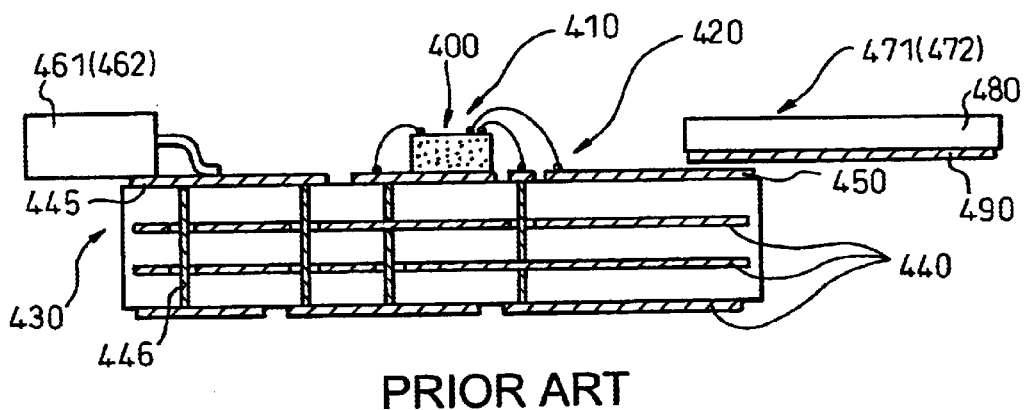
FIG. 8 is a sectional view showing the structure of a first example of the conventional module for mounting the driver IC.
Figure 9:
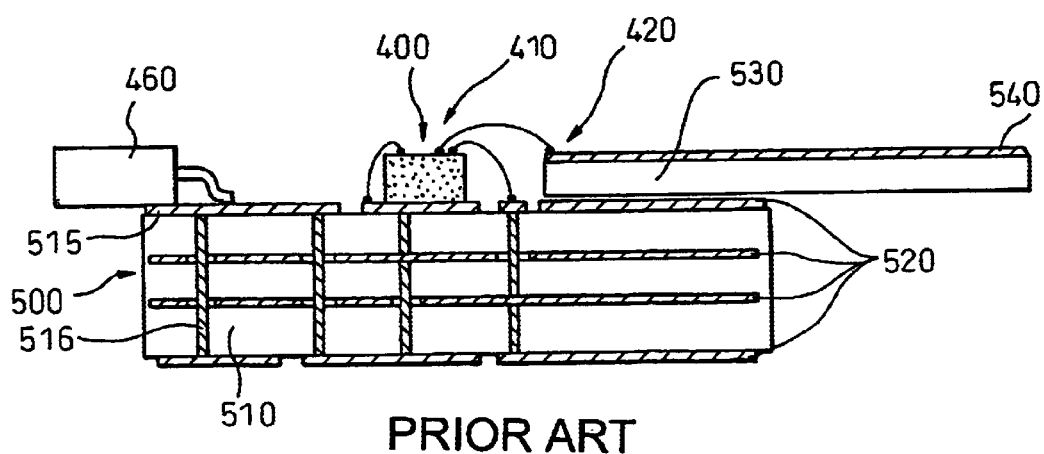
FIG. 9 is a sectional view showing the structure of a second example of the conventional module for mounting the driver IC.
Figure 10:
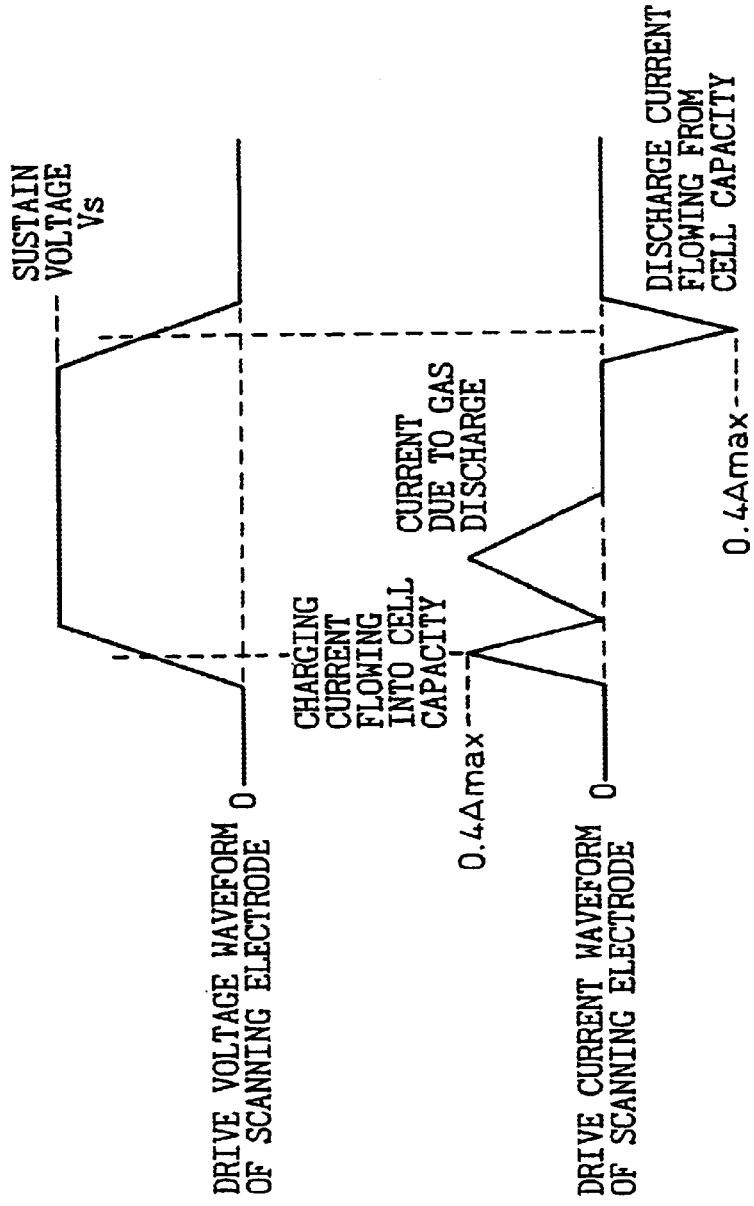
FIG. 10 is a timing chart showing the relationship between the drive voltage and the drive current of the scanning electrode of an ordinary surface discharge AC plasma display panel.

In the ALIS drive system, all the areas of the display panel defined by the sustain electrodes and the scanning electrodes are formed as a symmetric display cell, and the normal display operation of all the display cells is made possible by a new driving technique, thereby realizing a high definition display by increasing the display capacity to twice that of the conventional surface discharge AC plasma display panel (see FIG. 1, for example). The third to sixth embodiments described below provide a configuration of the module for mounting the driver IC to realize this drive method described above while maintaining a sufficiently low line impedance of the drive wiring system. Before explaining the third to sixth embodiments, the drive unit and the drive method for the surface discharge AC plasma display panel using the ALIS drive system providing the basis of the third to sixth embodiments will be explained.

Figure 15:
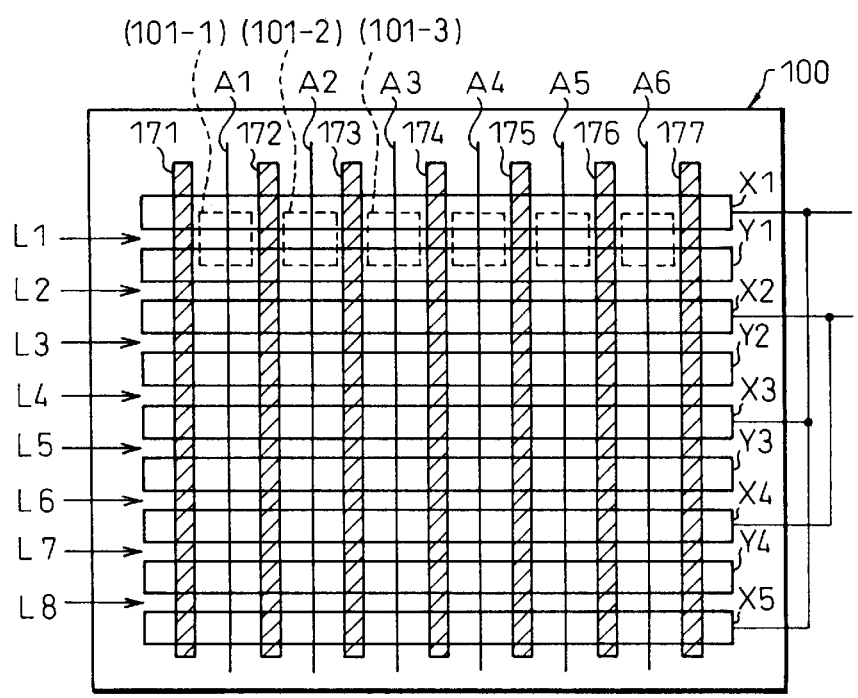
FIG. 15 is a plan view showing a schematic configuration of a surface discharge AC plasma display panel of interlace type.

FIG. 15 is a plan view showing a schematic configuration of a surface discharge AC plasma display panel of interlace type.

In the plasma display panel 100 shown in FIG. 15, pixels are indicated by dotted lines only for the display line (display row) L1. For simplification, the number of pixels of the plasma display panel 100 is set to 48 (=6×8) in terms of monochromatic display. The present invention is applicable to both the color and the monochromatic display, and one color pixel corresponds to three monochromatic pixels.

The plasma display panel 100 is constructed by removing the partition walls along the row from an ordinary plasma display panel in order to facilitate the fabrication and improve the definition by reducing the pixel pitch. In order to prevent the discharge error under the effect which one display line might have on an adjoining display line as the result of the removal of the partition walls, the phase of the voltage waveform of the sustain pulse is reversed between the odd lines and the even lines of the surface discharge electrodes L1 to L8 by the interlace scan as described later.

Figure 16:
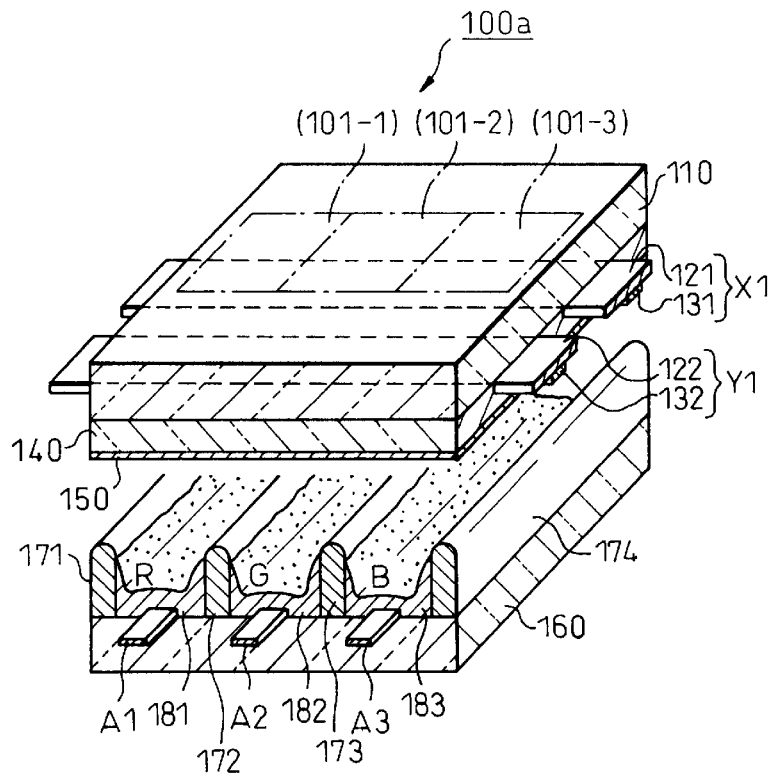
FIG. 16 is a perspective view showing the surface discharge AC plasma display panel of FIG. 15 with a widened internal space of a color pixel.
Figure 17:
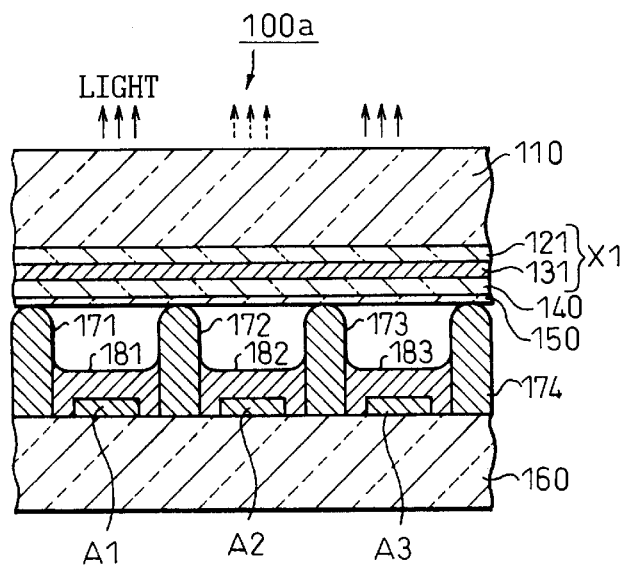
FIG. 17 is a longitudinal sectional view taken along the sustain electrode X1 of a color pixel of the surface discharge AC plasma display panel of FIG. 15.

FIG. 16 is a perspective view showing the plasma display panel of FIG. 15 with a widened internal space of a color pixel 100a; and FIG. 17 is a longitudinal sectional view taken along the sustain electrode X1 of the color pixel 100a of the plasma display panel of FIG. 15.

In FIGS. 16 and 17, transparent electrodes 121, 122 of ITO film or the like are arranged in parallel to each other on one surface of the glass substrate 110 and, in order to reduce the drop of the voltage along the length of the transparent electrodes 121, 122, metal electrodes 131, 132 of copper (Cu) or the like are formed along the center line on the transparent electrodes 121, 122, respectively. The transparent electrode 121 and the metal electrode 131 make up a sustain electrode X1, while the transparent electrode 122 and the metal electrode 132 constitute a scanning electrode Y1. A dielectric member 140 for holding the wall charges is covered on the electrode X1 and the electrode Y1, and further a MgO protective film 150 is deposited thereon.

On the other hand, addressing electrodes A1, A2 and partition walls 171 to 173 for separating the addressing electrodes A1, A2 are formed on the surface of the glass substrate 160 opposed to the MgO protective film 150 in the direction perpendicular to the sustain electrode X1 and the scanning electrode Y1. Due to these partition walls, discharge cells (normally called only cells or slits) are formed in the areas in which the addressing electrodes crosses the sustain electrode and the scanning electrode. Further, a phosphor 181 for generating red light, a phosphor 182 for generating green light and a phosphor 183 for generating blue light upon receiving ultraviolet rays are deposited between the partition walls 171, 172, between the partition walls 172, 173 and between the partition walls 173, 174, respectively. A penning mixture gas of Ne and Xe, for example, is sealed in the discharge space between each of the phosphors 181 to 183 and the MgO protective film 150.

The partition walls 171 to 174 shut out the ultraviolet light generated by the discharge from the adjoining pixels and at the same time function as a spacer for forming a discharge space. In the case in which the phosphors 181 to 183 are made of the same material, the plasma display panel 100 becomes monochromatic.

A plasma display panel drive unit using the plasma display panel shown in FIG. 15 includes a drive circuit for supplying each sustain electrode, each scanning electrode and each addressing electrode with a plurality of types of drive voltage pulses for writing predetermined display data in the selected cells, and a control circuit for controlling the sequence in which these drive voltage pulses are supplied. The drive circuit includes an odd/even X sustain circuit (common driver) for supplying the write pulse and the sustain pulse to the sustain electrodes X1 to X5, an odd/even Y sustain circuit (common driver) for supplying a scan pulse and a sustain pulse to the scanning electrodes Y1 to Y4, and an addressing circuit for supplying an addressing voltage pulse to the addressing electrodes A1 to A6.

Figure 18:
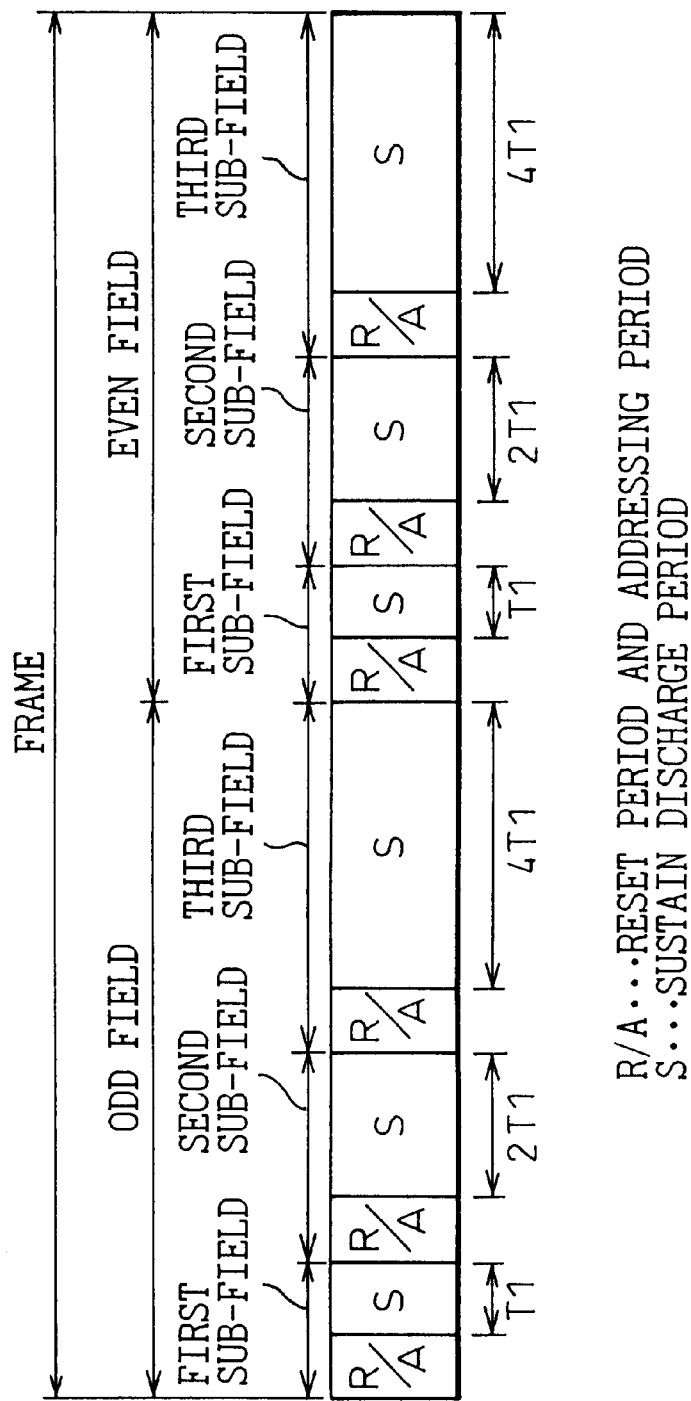
FIG. 18 is a diagram showing an example configuration of the frame for forming a color pixel of the surface discharge AC plasma display panel of FIG. 15.

FIG. 18 is a diagram showing an example configuration of a frame for forming a color image on the plasma display panel shown in FIG. 15; and FIG. 19 is a diagram showing the sequence of display scan during the addressing period of the frame shown in FIG. 18.

The frame shown in FIG. 18 is divided into an odd field and an even field, each of which includes first to third subfields. In each subfield of the odd field, each electrode of the plasma display panel 100 is supplied with a voltage having the waveform shown in FIG. 20 for displaying the display lines L1, L3, L5 and L7. In each subfield of the even field, on the other hand, each electrode of the plasma display panel 100 is supplied with the voltage of the waveform shown in FIG. 21 for displaying the display lines L2, L4, L6 and L8 shown in FIG. 15. In the first to third subfields, the sustain discharge period (S) is T1, 2T1 and 4T1, respectively, in each of which the sustain discharge is carried out the number of times proportional to the length of the particular period. As a result, the brightness assumes eight gradations. Similarly, in the case where the number of subfields is 8 and the ratio of the sustain discharge periods is 1:2:4:8:16:32:64:128, then the brightness assumes 256 gradations.

The display lines are scanned in the addressing period (indicated as a reset period & addressing period R/A in FIG. 18) in the order of the numbers indicated in the circles in portion (A) of FIG. 19. Specifically, the display lines L1, L3, L5 and L7 are scanned in that order in the odd field, and the display lines L2, L4, L6 and L8 are scanned in that order in the even field.

Figure 20:
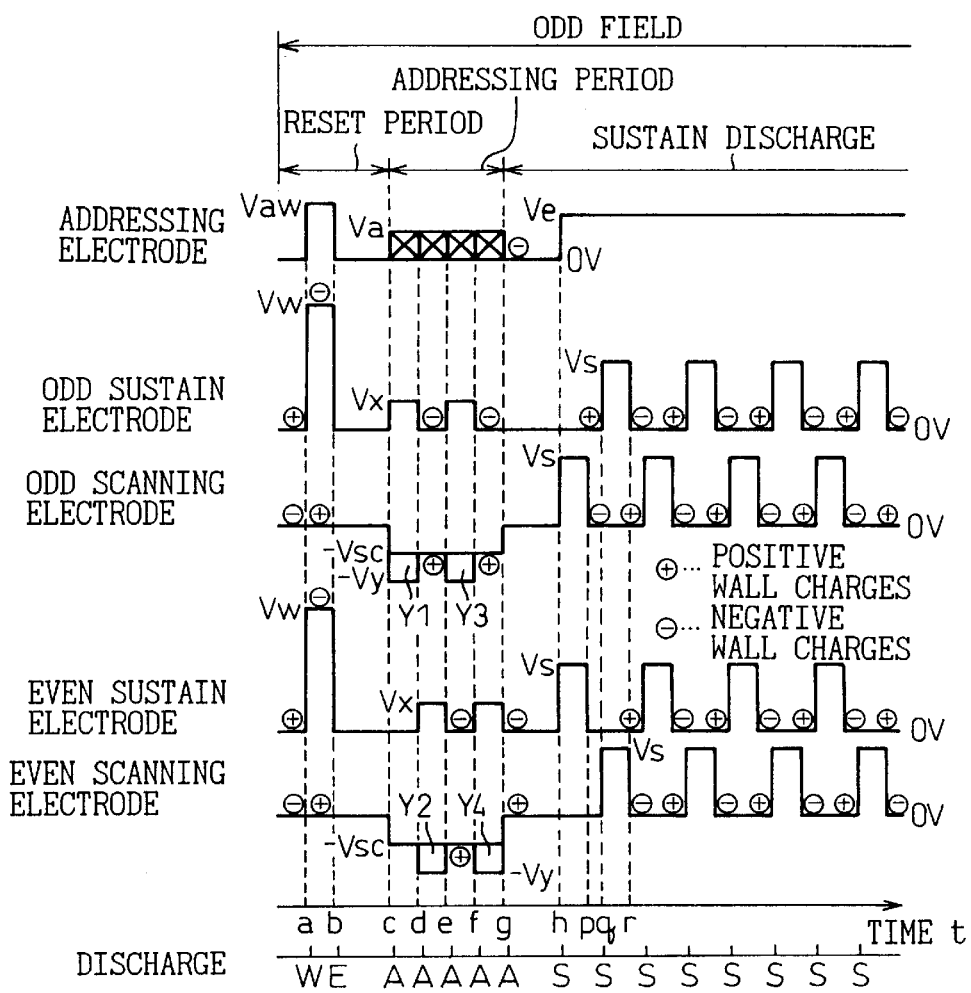
FIG. 20 is a diagram showing the voltage waveform applied to the electrodes in an odd field indicating a method of driving the surface discharge AC plasma display panel of FIG. 15.
Figure 21:
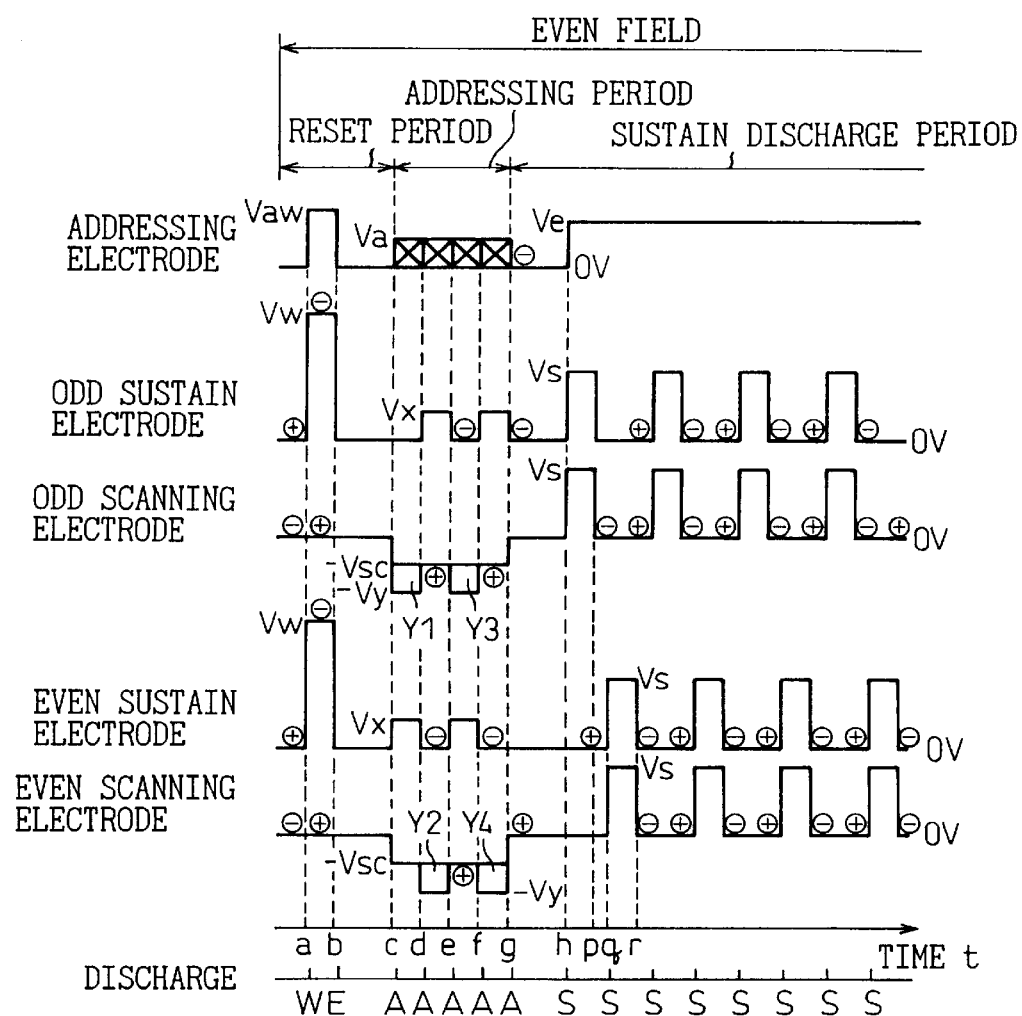
FIG. 21 is a diagram showing the voltage waveform applied to the electrodes in an even field indicating a method of driving the surface discharge AC plasma display panel of FIG. 15.

FIG. 20 is a diagram showing voltage waveform applied to the electrodes in an odd field according to a first conventional example of a method of driving the plasma display panel; and FIG. 21 is a waveform diagram of the voltage applied to the electrodes in an even field according to a first conventional example of a method for driving the plasma display panel. Actually, as shown in FIG. 18, the odd and even fields each have a plurality of subfields of different lengths of the sustain discharge period. For simplification, however, only one subfield is shown.

First, the operation in the odd field will be explained with reference to FIG. 20. In FIG. 20, characters W, E, A and S designate the time points when the write discharge over the whole surface, the erase discharge over the whole surface, the addressing discharge and the sustain discharge occur, respectively. For simplicity's sake, the following terms are used.

Sustain electrodes (i.e., X electrodes):
　Electrodes X1 to X5
Odd sustain electrodes: Electrodes X1, X3 and X5 Even sustain electrodes: Electrodes X2 and X4 Scanning electrodes (i.e., Y electrodes):
　Electrodes Y1 to Y4
Odd scanning electrodes: Electrodes Y1 and Y3 Even scanning electrodes: Electrodes Y2 and Y4 Addressing electrodes (i.e., A electrodes):
　Addressing electrodes A1 to A6
On the other hand, the following definition is used.

Yfxy: discharge start voltage between adjoining sustain electrodes and scanning electrodes Yfay: discharge start voltage between opposed addressing electrodes and scanning electrodes Vwall: voltage (wall voltage) between positive wall charges and negative wall charges due to the wall charges generated by the discharge between adjoining sustain electrodes and scanning electrodes Typically, Vfxy=290 V and Vfay=180 V. Further, the voltage between the addressing electrode and the sustain electrode is abbreviated to an "A-X elect rode voltage", the voltage between the addressing electrode and the scanning electrode is abbreviated to an "A-Y electrode voltage", and the voltages between other addressing electrodes and other sustain electrodes are also abbreviated to similar symbols, respectively.

(1) Reset Period

In the reset period, the voltage waveforms supplied to the sustain electrodes are the same for a write charge pulse over the whole surface (normally, simply referred to as the write pulse), the voltage waveforms applied to the scanning electrodes are the same for 0 V, and the voltage waveforms supplied to the addressing electrodes are the same for the intermediate voltage pulse.

First, the voltage applied to each electrode is 0 V. Due to the last sustain pulse during the sustain discharge period before the reset period, the positive wall charges exist (i.e., the positive wall charges remains) on the sustain electrode side, and the negative wall charges exist on the scanning electrode side of the cell (pixel) that has thus been turned on, i.e., the MgO protective film 150 of the display slit. Substantially no wall charges exist on the sustain electrode or the scanning electrode side of the pixel that has thus far been off, i.e., the non-display slit.

During the period expressed by a $\leq t \leq b$, the reset discharge pulse (i.e., write pulse) of voltage Vw is applied to the sustain electrode, and the intermediate voltage pulse of Vaw is applied to the addressing electrode. The relationship holds that Vw>Vfxy at Vw=310 V, for example, and regardless of the presence or absence of the wall charges, the write discharge W occurs over the whole surface (also referred to as the total cell write discharge since all the cells are involved regardless of whether the cells are turned on or turned off) between adjoining X and Y electrodes regardless of the presence or absence of the wall charges, and the electrons and positive ions generated are attracted by the electric field due to the X-Y electrode voltage Vw thereby to generate the wall charges of the opposite polarity (i.e., the wall charge of negative polarity). As a result, the electric field intensity in the discharge space is reduced so that the discharge is terminated in 1 μs to several μs. The voltage Vaw is about Vw/2 and, at the time of application of a reset discharge pulse, the A-X electrode voltage and the A-Y electrode voltage substantially become equal to each other in absolute value in opposite phases. Thus, the average wall charges attached to the phosphor by discharge is reduced substantially to zero.

With the fall of the reset discharge pulse at t=b, i.e., upon disappearance of the applied voltage of the opposite polarity to the wall voltage, the wall voltage Vwall between the X and Y electrodes increases beyond the discharge start voltage Vfxy, thereby causing the erase discharge over the whole surface (also referred to as the total cell erase discharge) E. In the process, the sustain electrode, the scanning electrode and the addressing electrode are all zero V. Ideally, therefore, the wall charges are not substantially generated by the erase discharge over the whole surface but ions and electrons are recombined in the discharge space and are almost completely neutralized. Actually, however, in the erase discharge over the whole surface, all the wall charges are not completely neutralized, but a small amount of wall charges of negative polarity remains in the cell.

(2) Addressing Period

During the addressing period, the voltage waveforms supplied to odd sustain electrodes are identical to each other, the voltage waveforms supplied to even sustain electrodes are also identical to each other, and the voltage waveforms supplied to the scanning electrodes not selected are identical to each other at voltage −Vsc. The scanning electrodes Y1 to Y4 are selected in that order, and the scanning electrodes selected are supplied with a scan pulse voltage of −Vy, while the unselected scanning electrodes are supplied with voltage −Vsc. For example, $$Vsc=Va=50 \text{ V}, Vy=150 \text{ V}$$

During the period when $c \leq t \leq d$, the scan pulse of voltage −Vy is supplied to the scanning electrode Y1, and the addressing voltage pulse of Va is applied to the addressing electrode for the cell to be turned on. The following relationship holds $$Va+Vy>Vfay$$

The addressing discharge occurs only for the cell to be turned on, and the wall charges of the opposite polarity are generated to terminate the discharge. At the time of this addressing discharge, only the electrode X1, of the electrodes X1 and X2 adjoining the electrode Y1, is supplied with a pulse of voltage Vx. Let Vxyt be the X-Y electrode discharge start voltage when triggered by the addressing discharge. The following relationship holds $$Vx+Vsc<Vxyt<Vx+Vy<Vfxy$$

The write discharge occurs between the electrodes X1 and Y1 on the display line L1, so that the wall charges of the opposite polarity are so small that no self discharge occurs is generated between the electrodes X1 and Y1 thereby to terminate the discharge. On the other hand, no discharge occurs between the electrodes X2 and Y1 on the display line L2.

During the period when $d \leq t \leq e$, on the other hand, the scan pulse of −Vy is applied to the electrode Y2, the even sustain electrode is supplied with a pulse of voltage Vx, and the addressing electrode is supplied with an addressing voltage pulse of Va for the cell to be turned on. In similar way, the write discharge occurs between the electrodes X2 and Y2 on the display line L3, so that the wall charges of the opposite polarity are generated, while no discharge is caused between the electrodes X3 and Y2 on the display line L4.

During the period when e≦t≦g, the following similar operation is performed.

In this way, the write discharge of the display data occurs for the cell to be turned on, on the display lines L1, L3, L5 and L7 in that order, the positive wall charges are generated on the scanning electrode, and the negative wall charges are generated on the sustain electrode. Specifically, the wall charges of the positive polarity are formed in the selected cell (display slit), while no wall charge is generated in the unselected cell (non-display slit).

(3) Sustain Discharge Period

During the sustain discharge period, a train of sustain pulses of the same phase and the same voltage is supplied to the odd sustain electrode and the even sustain electrode, so that a train of sustain pulses with the phase displaced by 180 degrees (½ period) is supplied to the even sustain electrode and the odd sustain electrode. On the other hand, in synchronism with the first rise of the sustain pulse, the addressing electrode is supplied with a voltage Ve which is held until the end of the sustain discharge period.

During the period when h≦t≦p, the odd scanning electrode and the even sustain electrode are supplied with sustain pulses of voltage Vs. The effective voltage of the cell between an odd Y electrode and an odd X electrode assumes Vs+Vwall, the effective voltage of the cell between an even Y electrode and an even X electrode assumes Vs−Vwall, and the effective voltage of the cell between an odd X electrode and an even scanning electrode and the cell between an even X electrode and an odd scanning electrode is given as 2Vwall. The following relationship holds.

$$Vs < Vfxy < Vs+Vwall, \quad 2Vwall < Vfxy$$

Thus, the sustain discharge occurs between the odd Y electrode, and the odd X electrode, and the wall charges of the opposite polarity are generated thereby to terminate the discharge. No sustain discharge occurs between the other electrodes. Therefore, the display of only the odd display lines L1 and L5 in the odd field is effective. Between the even Y electrode and the even X electrode, the sustain discharge fails to occur only at this first session.

During the period when q≦t≦r, a sustain pulse of voltage Vs is applied to the odd sustain electrode and the even scanning electrode. The effective voltage of the cell between the odd X electrode and the odd Y electrode and between the even Y electrode and the even X electrode are both Vs+Vwall. Thus the effective voltage between the odd Y electrode and the even X electrode and between the odd x electrode and the even Y electrode assumes zero. As a result, the sustain discharge occurs between the odd X electrode and the odd Y electrode and also between the even Y electrode and the even X electrode, so that the wall charges of the opposite polarity occurs thereby to terminate the discharge. No sustain discharge occurs between the other electrode s. Thus the display on all the odd display lines L1, L3, L5 and L7 in the odd field become effective at the same time.

A similar sustain discharge is repeated subsequently. In this case, as is obvious from the wall charges described in FIG. 20, the effective voltage of the cell between the odd Y electrode and the even X electrode and between the odd X electrode and the even Y electrode becomes zero on the non-display lines. The last sustain discharge during the sustain discharge period is adjusted in such a manner that the polarity of the wall charges assumes the first state of the reset period.

Now the operation of the even field will be explained. In FIG. 21, the display on the display lines L1, L3, L5 and L7 paired with the scanning electrodes Y1 to Y4 and the upper adjoining sustain electrodes X1 to X4 in the odd field in FIG. 15 are effective. In the even field, on the other hand, the display on the display lines L2, L4, L6 and L8 paired with the electrodes Y1 to Y4 and the lower adjoining electrodes X2 to X5 in FIG. 15 should be rendered effective. This can be accomplished by reversing the functions of the electrodes X1 and X2 with respect to the electrode Y1, and reversing the functions of the electrodes X2 and X3 with respect to the electrode Y2, followed by a similar process. Specifically, the voltage waveforms supplied to the odd sustain electrode and the even sustain electrode forming a group are replaced with each other. FIG. 21 shows waveforms applied in such a manner to the electrodes in the even field.

The operation in the even field is obvious from the foregoing description and FIG. 21. Generally speaking, the write discharge over the whole surface W and the erase discharge over the whole surface E are carried out during the reset period, and the electrodes Y1 to Y4 are sequentially selected and the write discharge of the display data are carried out on the display lines L2, L4, L6 and L8 in that order during the addressing period. During the sustain discharge period, on the other hand, the sustain discharge is repeated simultaneously on the display lines L2, L4, L6 and L8.

Further, in FIGS. 20 and 21, power consumption can be reduced if the number of voltage pulses can be reduced. If the pulses can be continuously supplied to the odd sustain electrodes and the even sustain electrodes during the addressing period, the number of pulses can be reduced. To realize this, the scanning sequence is determined as shown in portion (B) of FIG. 19. Specifically, the display lines L1, L3, L5 and L7 in the odd field are further divided into odd and even lines, either of which are sequentially scanned followed by scanning the other sequentially. The same can be said also concerning the even field.

Figure 22:
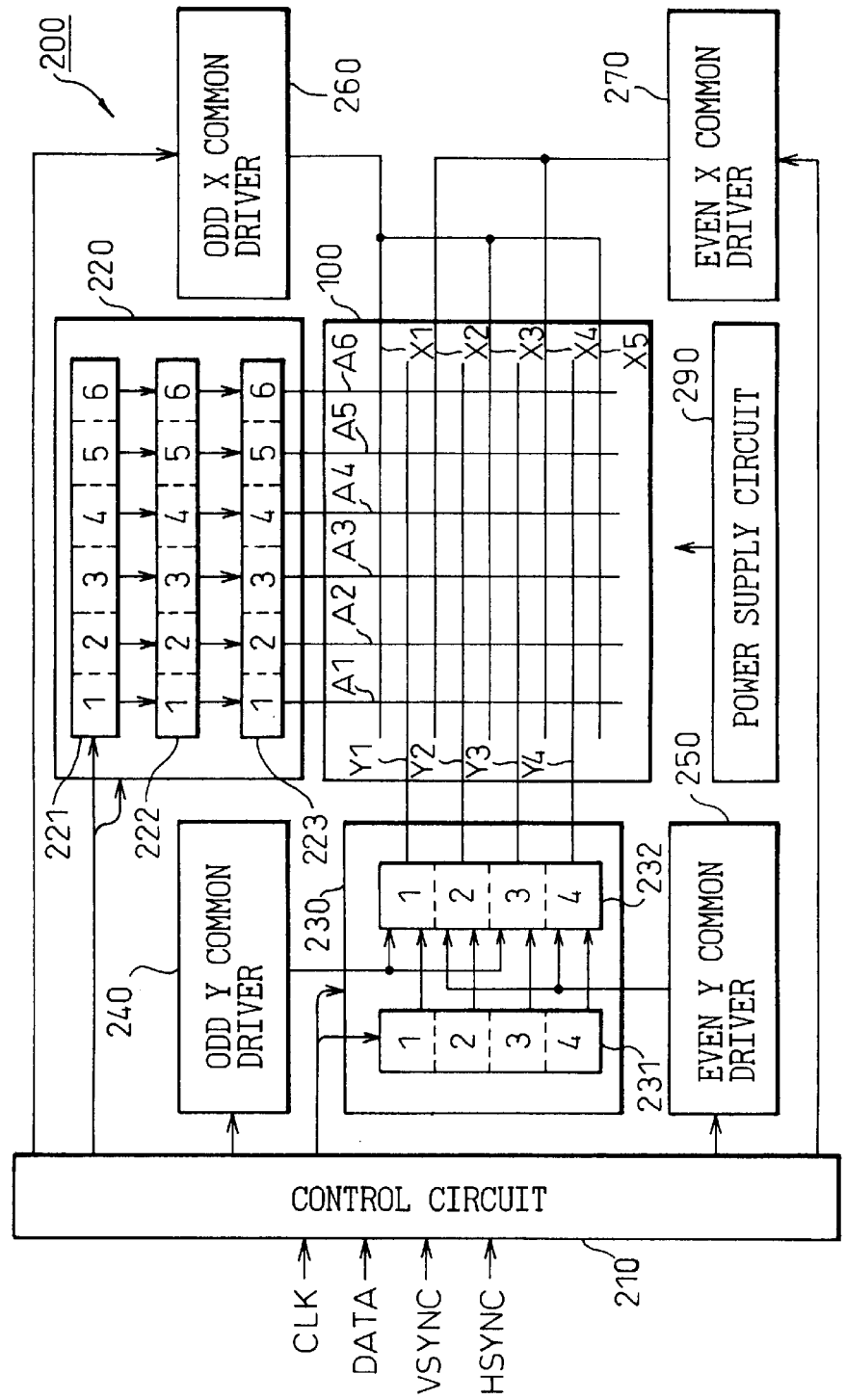
FIG. 22 is a block diagram showing a schematic configuration of the drive unit for the surface discharge AC plasma display panel of FIG. 15.

FIG. 22 is a block diagram showing a schematic configuration of the drive unit for the surface discharge AC plasma display panel of FIG. 15.

In the plasma display panel drive unit 200 shown in FIG. 22, the control circuit 210 converts the data signal DATA supplied from an external source into the data for the display panel 100 including a plasma display panel, and supplies the resulting data to the shift register 221 of the addressing circuit 220. Further, the control circuit 210 generates a plurality of control signals based on the clock signal CLK supplied from an external source, a vertical synchronous signal VSYN and the horizontal synchronous signal HSYN and supplies them to various drive circuits.

Voltages Vaw, Va and Ve are supplied to the addressing circuit 220 from the power source circuit 290 in order to apply the drive voltage waveforms shown in FIGS. 21 and 22 to the various electrodes. Also, the voltages −Vsc, −Vy and −Vs are supplied to the odd Y common driver 240 and the even Y common driver 250, while the voltages Vw, Vx and Vs are supplied to the odd X common driver 260 and the even X common driver 270.

The numerical values in the shift register 221 are for identifying the elements of the same configuration. For example, 221(3) indicates the third bit of the shift register 221. This is also the case with other component elements.

In the addressing circuit 220, upon application of the display data for one line (one display line) from the control circuit 210 to the shift register 221, the bits 221(1) to (6) are held as the bits 223(1) to (6) of the latch circuit 222, respectively. According to the values of these bits, the on/off operation of the switching elements (not shown) in the address drivers 223(1) to (6) is controlled, so that the binary voltage pattern of voltage Va or 0 V are supplied to the addressing electrodes A1 to A6.

The scanning circuit 230 includes a shift register 231 and a scanning driver 232. During the addressing period, the digit "1" is supplied to the serial data input terminal of the shift register 231 only in the first address cycle of the vertical synchronous signal VSYN, so that the shift register 231 is shifted in synchronism with the address cycle. According to the values of bits 231(1) to (4) in the shift register 231, the on/off operation of the switching elements (not shown) in the scanning drivers 232(1) to (6) is controlled, so that the select voltage −Vy or the non-select voltage −Vsc is applied to the scanning electrodes Y1 to Y4.

Specifically, the scanning electrodes Y1 to Y4 are sequentially selected by the shift of the shift register 231, a select voltage −Vy is applied to the selected scanning electrode Y, and the non-select signal −Vsc is applied to the unselected scanning electrode Y. These voltages −Vy and −Vsc are supplied from the odd Y common driver 240 and the even Y common driver 250. During the sustain discharge period, the first train of the sustain pulses is supplied to the odd-numbered scanning electrodes Y1 and Y3 through the scanning drivers 232(1) and 232(3) from the odd Y common driver 240. On the other hand, the second train of sustain pulses 180° out of phase with the first train of sustain pulses is supplied to the even-numbered scanning electrodes Y2 and Y4 from the even Y common driver 250 through the scanning drivers 232(2) and (4).

In the circuit of the sustain electrode X, during the sustain discharge period, the odd-numbered sustain electrodes X1, X3 and X5 are supplied with the second train of sustain pulses from the odd X common driver 260, and the even-numbered sustain electrodes X2 and X4 are supplied with the first train of sustain pulses from the even X common drier 270. During the reset period, on the other hand, the write discharge pulse over the whole surface is supplied to the sustain electrodes X1 to X5 as a common pulse from the odd x common driver 260 and the even X common driver 270. During the addressing period, in accordance with the scan pulse, a pulse train of two address cycles is supplied from the odd X common driver 260 to the odd-numbered sustain electrodes X1, X3 and X5, while a pulse train 180° out of phase with the aforementioned pulse train is supplied from the even X common driver 270 to the even-numbered electrodes X2 and X4.

In other words, the circuits 223, 232, 240, 250, 260 and 270 constitute switching circuits for turning on/off the voltage supplied from the power source circuit 290.

For realizing the method of driving the surface discharge AC plasma display panel of interlace type described above, the sustain voltage pulse generating circuits on the scanning electrode and the sustain electrode of the drive circuit are each divided into two circuits for the odd and even electrodes, respectively, and in accordance with the divided configuration, the driver IC chip is also divided into an odd circuit driver IC group and an even circuit driver IC group. Then, after the output is produced from the two driver IC groups, the wiring are crossed and rearranged at odd and even positions thereby to obtain a predetermined output terminal arrangement.

In the conventional configuration of the module for mounting the driver IC, the cross wiring for rearranging the output terminal wiring pattern requires a multilayer wiring board, and therefore a wiring board (i.e., a base board) having a driver IC chip mounted thereon is used. For crossing a multiplicity of output terminal wiring, however, a vast wiring area is required and as many conduction through holes as at least one half of the number of the wires for wiring are required to be formed between different wiring layers.

In consequence, a sufficient wiring area is difficult to secure for the drive wiring system including the ground wiring layer and the high voltage power source wiring layer of the base board, thereby posing the problem described above.

The configuration of the module for mounting the driver IC according to the third to sixth embodiments of the present invention has been developed in order to obviate such a problem.

Figure 23:
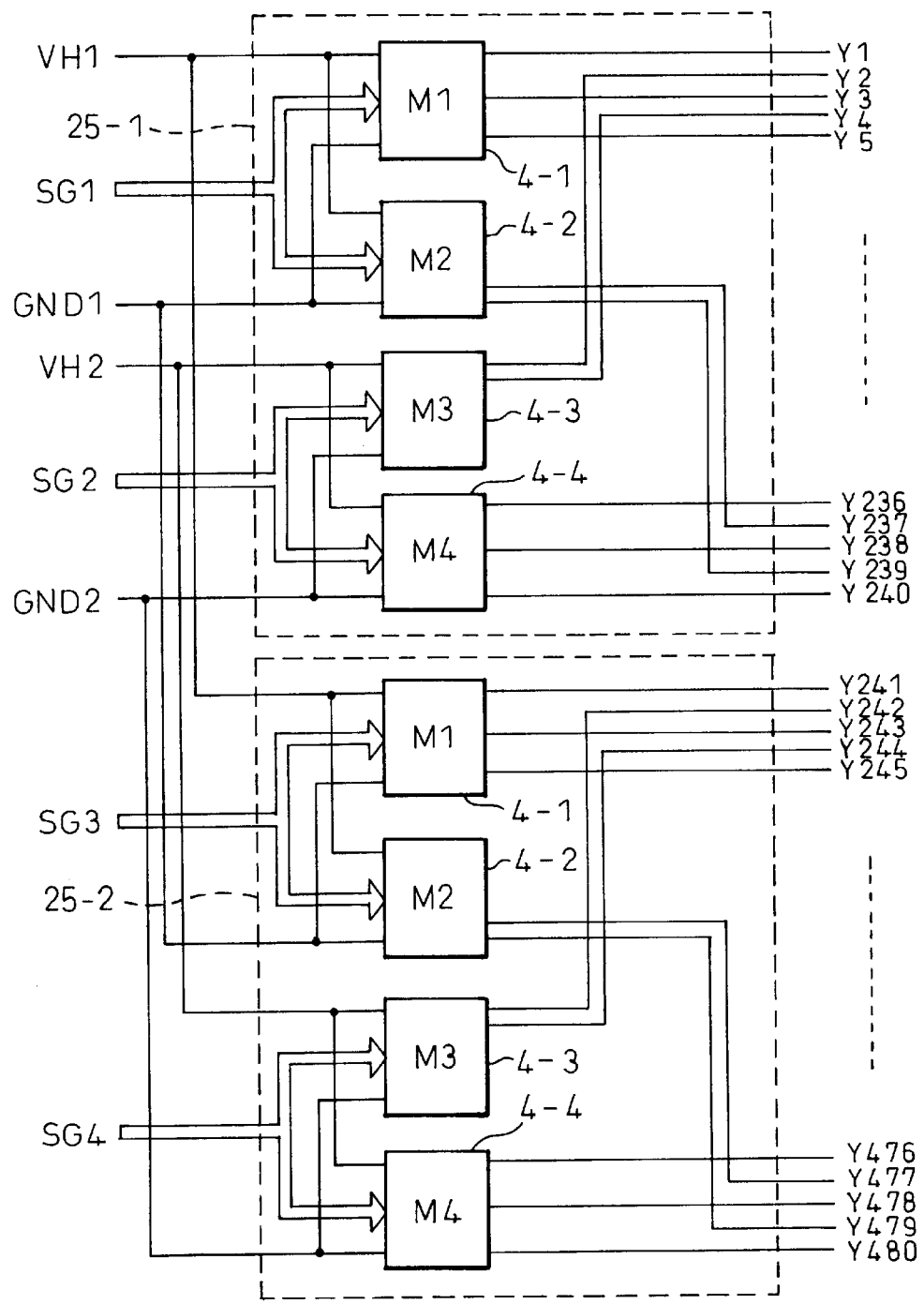
FIG. 23 is a block diagram showing a circuit configuration of the module for mounting the driver IC according to a third embodiment of the present invention.
Figure 24:
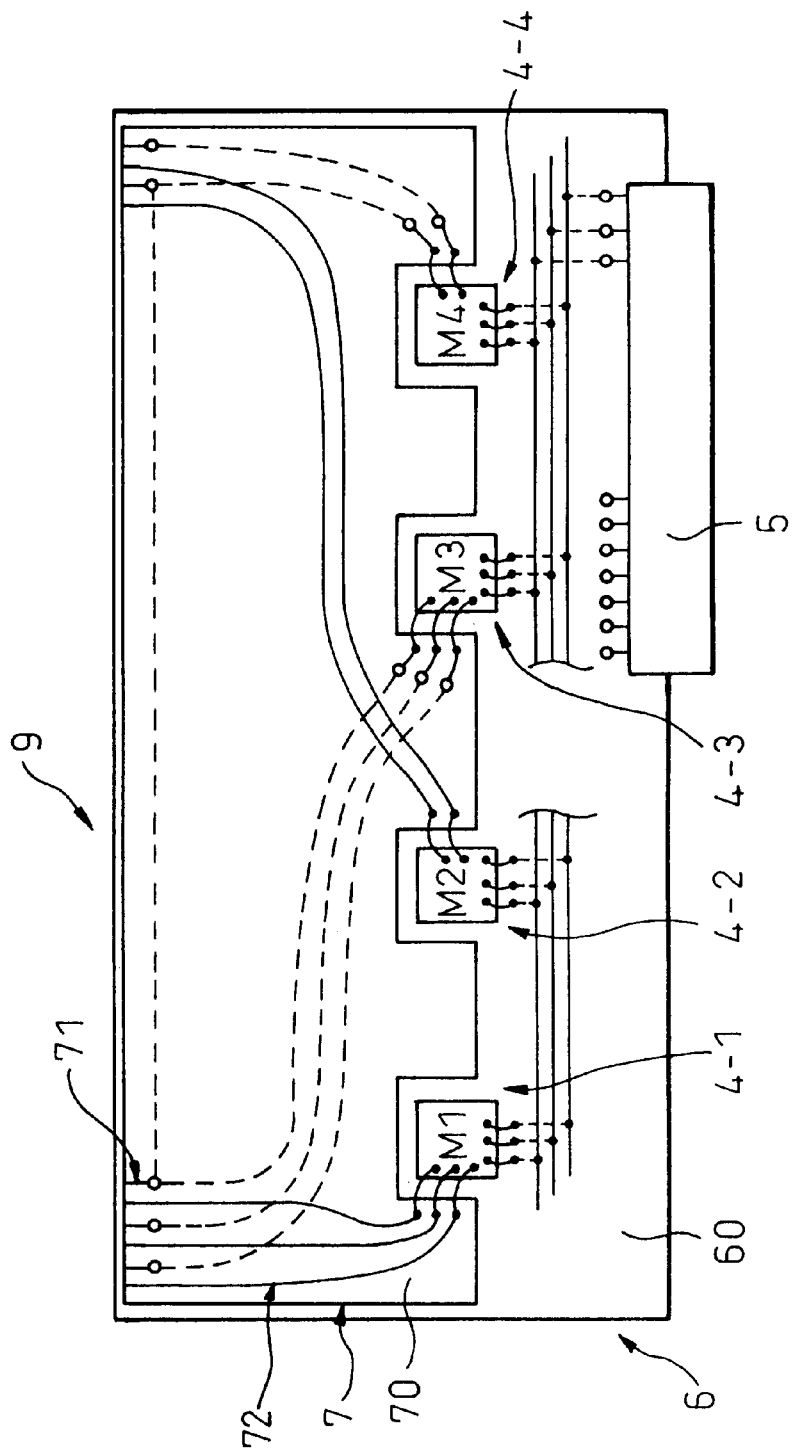
FIG. 24 is a plan view showing a structure of the module for mounting the driver IC according to the third embodiment of the present invention.
Figure 25:
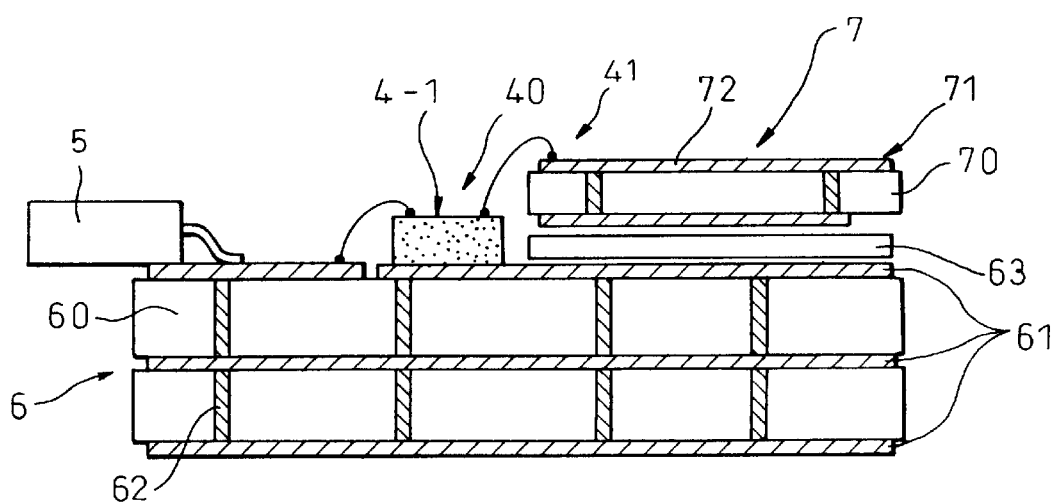
FIG. 25 is a sectional view showing a structure of the module for mounting the driver IC according to the third embodiment of the present invention.

FIG. 23 is a block diagram showing a circuit configuration of the module for mounting the driver IC according to a third embodiment of the present invention; FIG. 24 is a plan view showing the structure of the module for mounting the driver IC according to the third embodiment of the present invention; and FIG. 25 is a sectional view of the structure of the module for mounting the present driver IC according to the third embodiment of the present invention.

In the third embodiment of the invention, as is clear from FIGS. 23 and 24, like the first and second embodiments, the configuration of the module (9) for mounting the driver IC constituting one of the modules 25-1, 25-2 for mounting the driver IC on the scanning electrode is shown.

This module for mounting the driver IC uses four driver IC chips 4-1 to 4-4 (M1 to M4). The odd circuit driver IC chips 4-1, 4-2 which constitute an odd circuit driver IC group for driving the odd-numbered output terminal units of odd circuits are separately mounted from the even circuit driver IC chips 4-3, 4-4 constituting an even circuit driver IC group for driving the even-numbered output terminal units of even circuits.

The mounting board according to the third embodiment is generally configured to form a composite board in which a baste board 60 making up the base is bonded, on the surface thereof, with a cross wiring board 70 for rearranging the output terminals of the odd circuit driver IC group (M1, M2) and the even circuit driver IC group (M3, M4). This mounting board further includes an input connector 5 of the input unit and an output terminal arrangement 71 of the output unit.

First, the base board 60 will be described in detail. Signals (a control signal and five logic power lines) SGl1 to SG4, high voltage power source wirings VH1, VH2 and ground wiring GND1, GND2 are included for activating the driver IC chips 4-1 to 4-4 using a multilayer wiring board of 2 to 4 layers. The input signal lines and the power supply line are connected to predetermined patterns (the input signal line and the power line wiring patterns 61, for example) through the input connector 5 of the input unit, and led out to the peripheral portion of the IC chip mount on the surface of the board by the multilayer wire having conduction through holes 62 thereby to form a connecting terminal for the driver IC chip. The input signal line and the power supply line wiring patterns 61 formed on the base board 60 correspond to the fourth wiring unit 6 according to the present invention.

Further, the cross wiring board 70 constituting a two-layer wiring board includes a connecting terminal 41 with an output pad terminal 40 and a cross wiring pattern 72 for the driver IC chip in the vicinity of the end surface in proximity to the driver IC chip on the surface thereof and an output terminal arrangement 71 on the end surface far from the driver IC chip.

The wiring configuration of the cross wiring pattern 72 is such that the output terminal wiring is extended from the odd circuit driver IC chip using the surface thereof as an odd terminal of the output terminal unit. On the other hand, the output terminal wiring from the even circuit driver IC chip is extended along the back, through the conduction through holes, and raised up to the front surface from the back side before the output terminal unit, through the conduction through holes, and thus led out as an even terminal of the output terminal unit. The cross wiring pattern 72 and the output terminal arrangement 71 formed on the cross wiring board 70 correspond to the fifth wiring unit 7 according to the present invention.

The cross wiring board 70 described above is deposited on the base board 60. For insulating the boards, the cross wiring board 70 is bonded through an insulating material or an insulating plate 63.

The driver IC chip and the board are electrically connected with each other by fixedly mounting the driver IC chip on a die bonding pad on the base board, and then connecting the pad terminal for the input signal of the driver IC chip and the power supply to a corresponding terminal on the base board by wire bonding and also by connecting the output pad terminal of the driver IC chip to the corresponding output terminal unit of the cross wiring board 70 by wire bonding.

After this connection by wire bonding, the driver IC chip, the wire and the connecting terminal are sealed with resin for protection against humidity.

When building the module for mounting the driver IC fabricated in this way into the display unit, a flexible cable is separately prepared for connecting the output terminal unit of the module for mounting the driver IC in one-to-one correspondence with the terminal of the display electrode of the display panel, so that the terminals are connected through this flexible cable or the like.

With the configuration according to the third embodiment described above, the cross wiring of the output line from the driver IC chip is mounted on a board separate from the board for mounting the driver IC chip. Therefore, a sufficient wiring area for the ground wiring and the high voltage power source wiring to the driver IC chip can be secured, thereby maintaining a low impedance of the lines of the driving wiring system. As a result, a new driving method (i.e., the ALIS driving system) can be positively realized using the display cells between all the scanning electrodes and the sustain electrodes while at the same time securing stable display characteristics and an operation margin of the display panel.

Figure 26:
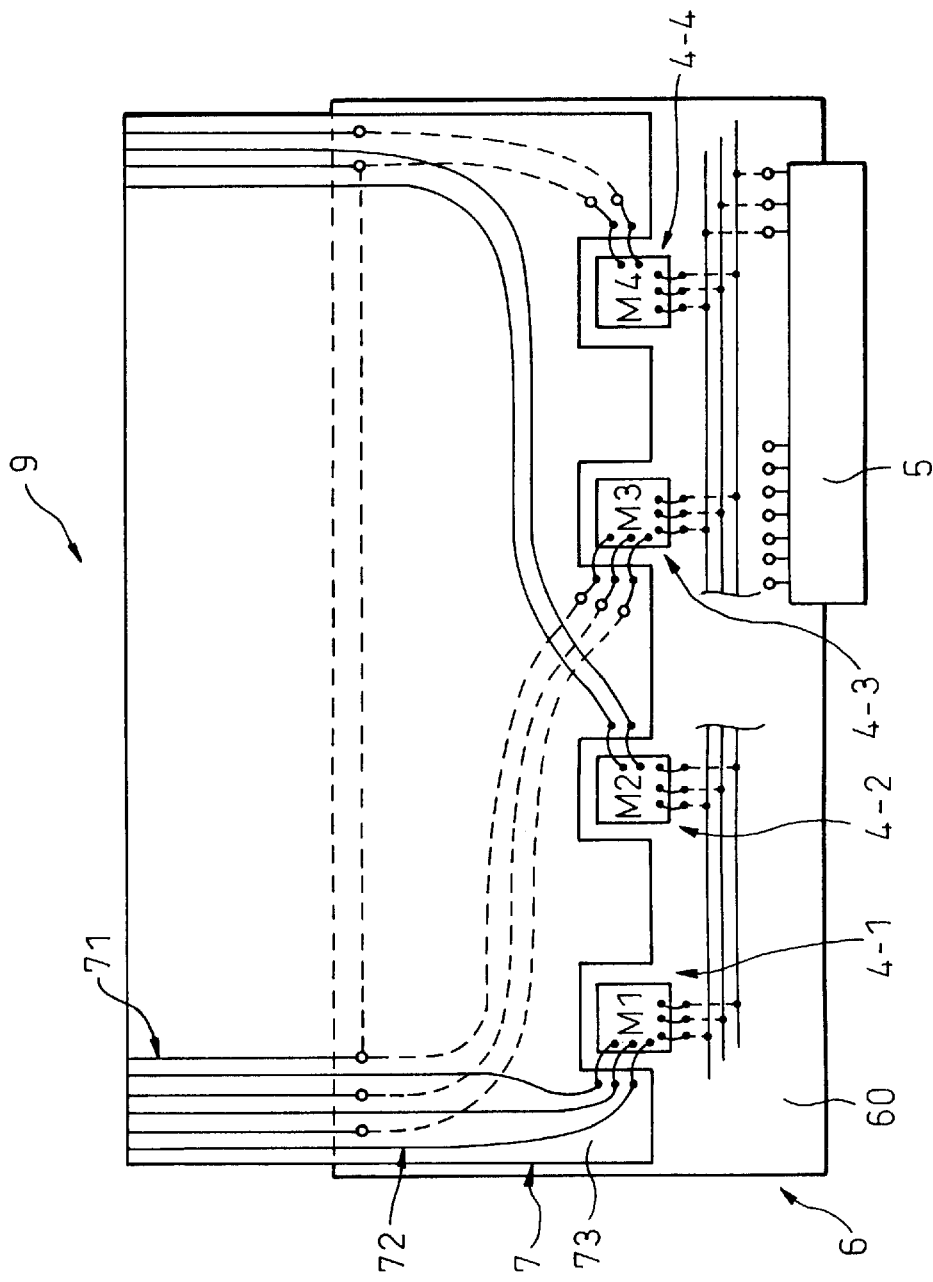
FIG. 26 is a plan view showing a structure of the module for mounting the driver IC according to a fourth embodiment of the present invention.
Figure 27:
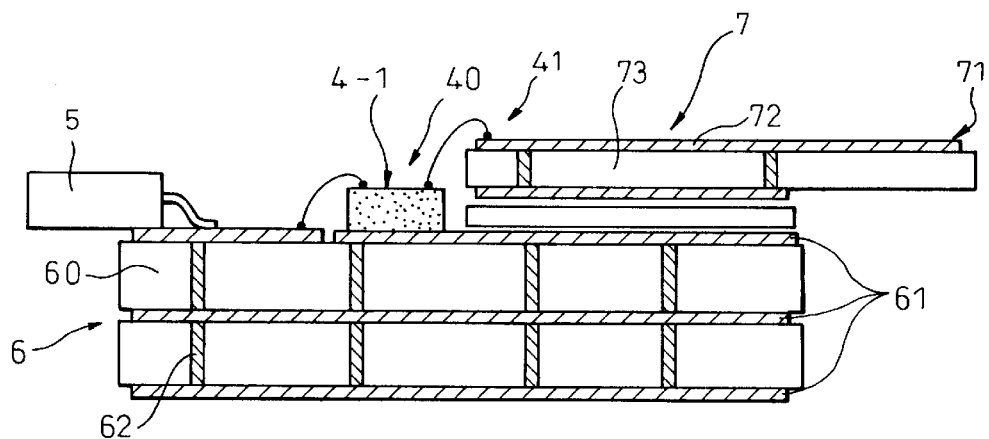
FIG. 27 is a sectional view showing a structure of the module for mounting the driver IC according to the fourth embodiment of the present invention.

FIG. 26 is a plan view showing the structure of a module for mounting the driver IC according to a fourth embodiment of the present invention; and FIG. 27 is a sectional view showing the structure of a module for mounting the driver IC according to the fourth embodiment of the present invention.

The fourth embodiment of the present invention represents an example application to the module for mounting the driver IC on the scanning electrode for realizing a new driving method like the third embodiment described above, and the configuration for separating and mounting the driver IC chip is identical to that of the third embodiment.

In the module 9 for mounting the driver IC according to the fourth embodiment, the configuration of the base board 60 constituting the base is substantially the same as that of the third embodiment but is different from the third embodiment in that the cross wiring board for rearranging the output terminal wiring pattern is constituted of a flexible wiring board 73 made of polyimide film or the like.

This flexible wiring board 73, substantially similar to that of the third embodiment described above, forms an output terminal wiring pattern 72 for rearrangement by a double-layer wiring structure and includes an output terminal wiring set 71 on the end surface far from the driver IC chip. Like in the first and second embodiments described above, however, the output terminal unit is extended somewhat longer than the area for bonding with the base board 60, so that the output terminal unit itself can be directly used as a terminal for connection with the terminal of the display electrode.

The electrical connection between the driver IC chip and each board is substantially similar to that described above in the third embodiment, and therefore will not be described again.

The module for mounting the driver IC according to the fourth embodiment described above can be built in the display unit directly by means of thermocompression bonding to the terminal of the display electrode of the display panel, because the output terminal set 71 is taken out directly by the flexible wiring board 73, unlike in the third embodiment. Thus, the smaller number of the components required reduces the cost and the smaller number of the connections required reduces the number of fabrication steps for an improved reliability.

As described above, in the configuration of the fourth embodiment, a new driving method such as the ALIS driving system can be easily realized, while at the same time reducing the cost and improving the reliability.

Figure 28:
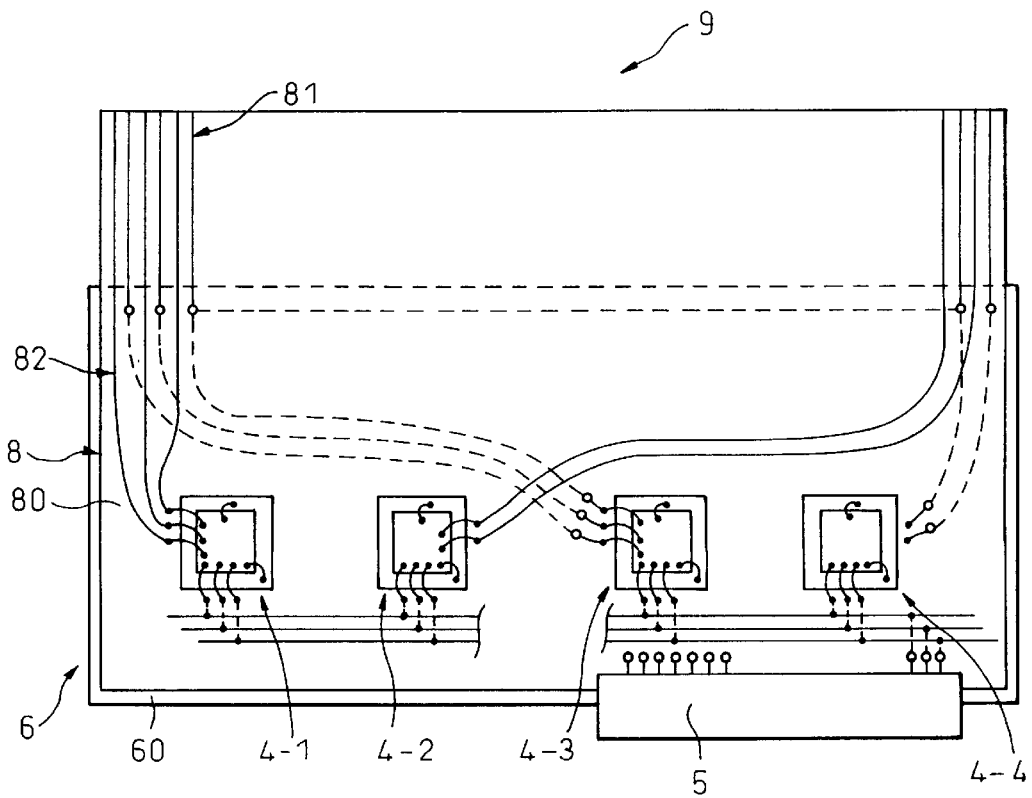
FIG. 28 is a plan view showing a structure of the module for mounting the driver IC according to a fifth embodiment of the present invention.
Figure 29:
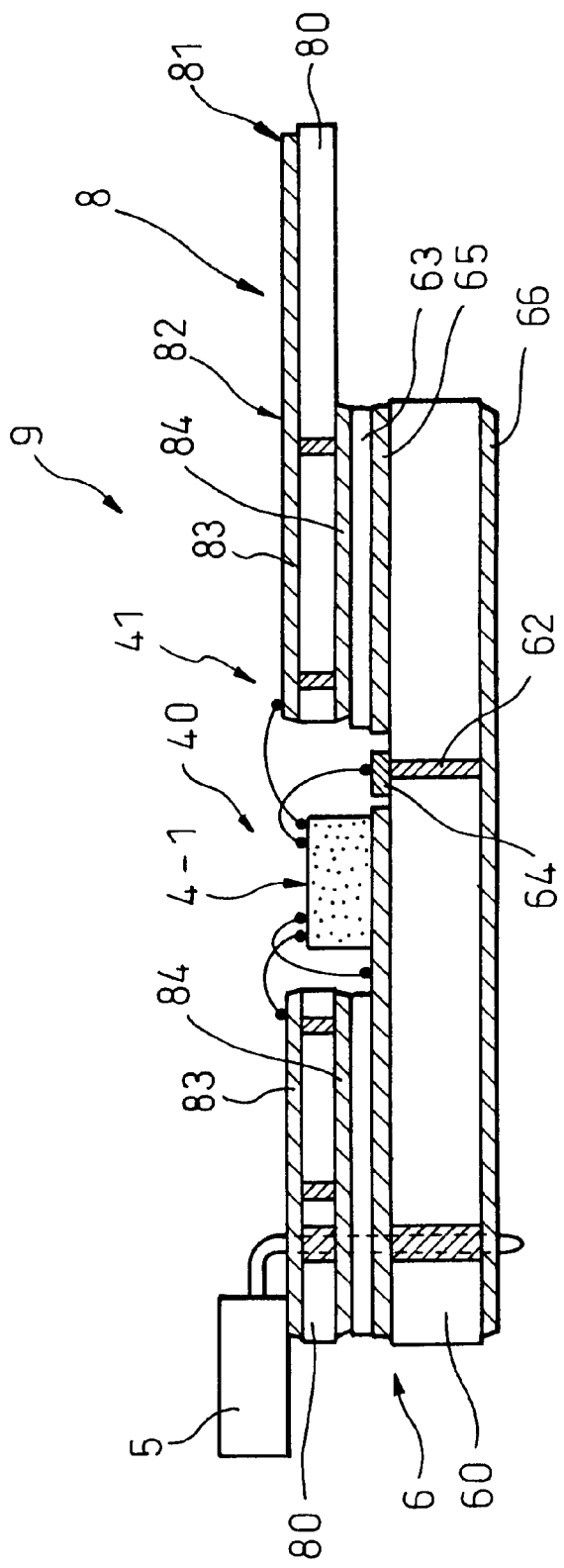
FIG. 29 is a sectional view showing a structure of the module for mounting the driver IC according to the fifth embodiment of the present invention.

FIG. 28 is a plan view showing the structure of a module for mounting the driver IC according to a fifth embodiment of the present invention; and FIG. 29 is a sectional view showing the structure of the module for mounting the driver IC according to a fifth embodiment of the present invention.

The fifth embodiment of the present invention represents an example in which a module for mounting a driver IC according to the present invention is applied to the module for mounting the driver IC on the scanning electrode for realizing a new driving method as in the third and fourth embodiments, and has the same configuration for isolating and mounting the driver IC as the third and fourth embodiments.

The module 9 for mounting the driver IC according to the fifth embodiment uses a common flexible wiring board 80 for two-side wiring made of polyimide film or the like as a cross wiring board of the input and output units.

The feature of the configuration of the fifth embodiment lies, like the second embodiment described above, in that both the input and output wiring systems are configured by the cross wiring using a two-side common flexible wiring board. Specifically, the module for mounting the driver IC according to the fifth embodiment is intended to realize two wiring patterns including an upper side wiring pattern 83 and a lower side wiring pattern 84 with a single flexible wiring board. The upper side wiring pattern 83 and the lower side wiring pattern 84 formed on the two-side common flexible wiring board 80 make up a common flexible wiring unit 8.

Further, this common cross wiring board 80 includes a connecting terminal 41 with an output pad terminal 40 and a cross.wiring pattern 82 for the output of the driver IC chip in the vicinity of the end surface thereof in proximity to the driver IC chip on the surface thereof, and an output terminal set 81 on the end surface thereof far from the driver IC chip.

The wiring configuration of the cross wiring pattern 82 is such that the output terminal wiring from the odd circuit driver IC chip is extended directly along the surface thereof and led out as an odd terminal of the output terminal unit, while the output terminal wiring from the even circuit driver IC chip is turned around the back by way of conduction through holes, and raised to the front side through the conduction through holes from the back at a point before the output terminal unit, and thus taken out as an even terminal of the output terminal unit.

The complete assembly of the common flexible wiring board 80 is attached to the base board 60 thereby to complete the base board portion of the module for mounting the driver IC.

In the embodiment shown in FIGS. 28 and 29, a double layer pattern including the high voltage source pattern 66 making up a high voltage power source wiring VH and a ground pattern 65 making up a ground wiring GND is formed on the base board 60 as a wiring pattern of the base board 60. The voltage from the high voltage power source of the high voltage power source pattern 66 is connected to the driver IC chip, through the conduction through holes 62 and the connecting terminal 64.

More specifically, the embodiment of FIGS. 28 and 29 comprises a fourth odd-circuit wiring unit formed with a drive power system wiring (drive wiring system) for driving the display panel, through the odd circuit driver IC group and a control system wiring (input wiring system) for supplying various signals input to the odd circuit driver IC group for controlling the driver IC chip, and a fourth even-circuit wiring unit formed with a control system wiring (input wiring system) for supplying various signals input to the even circuit driver IC group for controlling the driver IC chip. Further, the fifth wiring unit in this embodiment is structured to form a cross wiring pattern (wiring layer) for leading the output signal of the odd circuit driver IC group out to the corresponding to the odd-numbered output terminal set (output terminal wiring) and leading the output signal of the even circuit driver IC group to the corresponding even-numbered output terminal set (output terminal wiring).

Furthermore, in the embodiment of FIGS. 28 and 29, the drive power source system wiring and the control system wiring in the fourth wiring unit for odd circuits are arranged as a first wiring pattern and a second wiring pattern, respectively. At the same time, the drive power source system wiring and the control system wiring in the fourth wiring unit for even circuits are arranged as a third wiring pattern and a fourth wiring pattern, respectively.

In addition, according to the embodiment of FIGS. 28 and 29, the first wiring pattern and the third wiring pattern are formed on the base board of rigid type, and at the same time, the second wiring pattern, the fourth wiring patter and the fifth wiring pattern are formed on a flexible wiring board.

In other words, the wiring other than the high voltage source wiring VH and the ground wiring GND is not substantially required to be arranged on the base board 60 of the fifth embodiment. Therefore, a sufficient area for these driving wiring systems can be secured, so that the number of the wiring layers of the base board itself can be reduced (to approximately two layers, for example) as compared with the third and fourth embodiments described above, and therefore the size can be reduced with a remarkable cost reduction.

Figure 30:
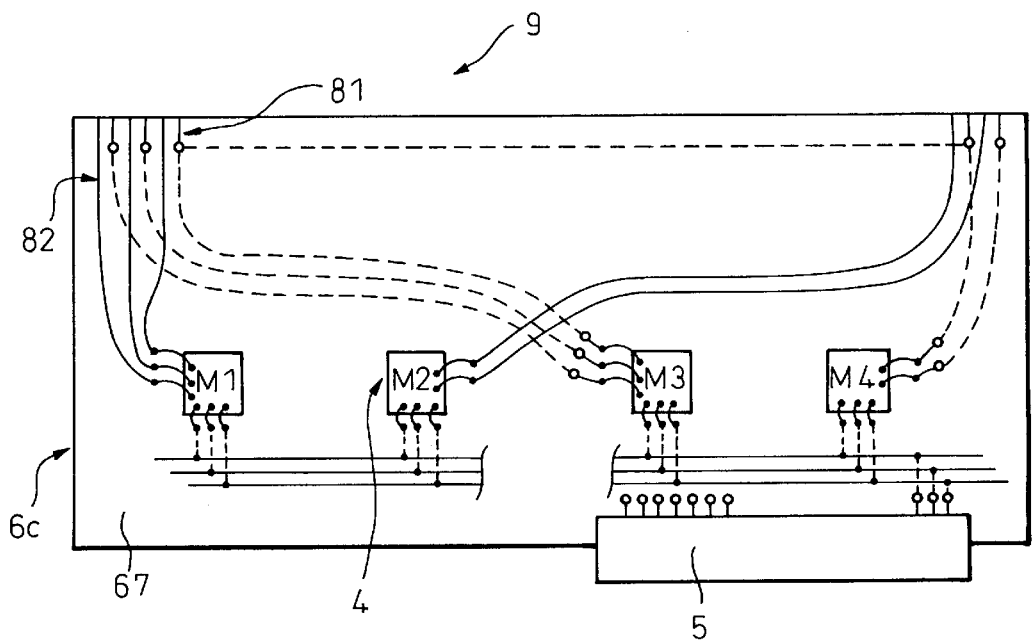
FIG. 30 is a plan view showing a structure of the module for mounting the driver IC according to a sixth embodiment of the present invention.
Figure 31:
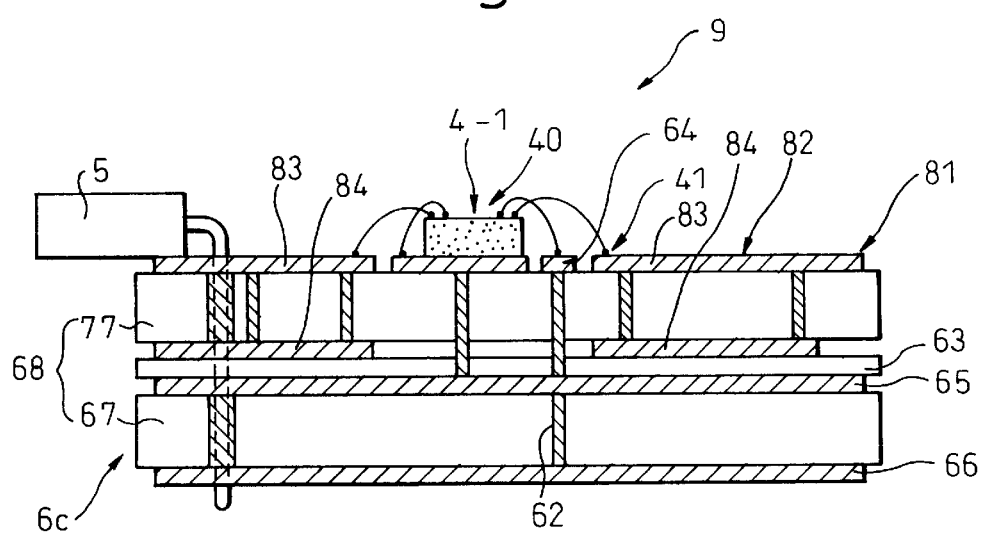
FIG. 31 is a sectional view showing a structure of the module for mounting the driver IC according to the sixth embodiment of the present invention.

FIG. 30 is a plan view showing the structure of a module for mounting the driver IC according to a sixth embodiment of the present invention; and FIG. 31 is a sectional view showing the structure of a module for mounting the driver IC according to the sixth embodiment of the present invention.

The sixth embodiment of the present invention represents an example application to the module for mounting the driver IC on the scanning electrode for realizing a new driving method as in the third to fifth embodiments described above, and has the same configuration as the third and fifth embodiments for isolating and mounting the driver IC chip.

The module 9 for mounting the driver IC according to the sixth embodiment is devised to lay a complicated cross wiring on the base board itself thereby to form a common board 68 including the cross wiring board unit 77, thus simplifying the whole module for mounting the driver IC.

Specifically, the common board 68 used for the module for mounting the driver IC according to the sixth embodiment is formed with a common cross wiring board unit 77 including a cross wiring layer on the surface layer of the base board unit 67 and thus is fabricated by being formed integrated as a common board as a whole.

In fabricating this common board, the first step is to produce the cross wiring board (common cross wiring board unit 77) by conduction through holes using the front layer and the back layer of a two-side board made of glass epoxy material.

This common cross wiring board unit 77 is formed with an input unit cross wiring pattern similar to the one in the first embodiment, an output unit cross wiring pattern 82 similar to the one in the third embodiment described above, and an output terminal set 81 led out of the same cross wiring patterns, thereby forming the required wiring for the terminals for connection with the input/output pad terminals and the die bonding pattern of the driver IC chip mount. The input unit cross wiring pattern of the module for mounting the driver IC makes up a common wiring unit 6c, and the output unit cross wiring pattern and the output terminal set make up an output terminal unit.

Then, the base board unit, as in the fifth embodiment described above, is fabricated of a two-side glass epoxy board with a ground pattern 65 deposited over the whole front surface layer and a high voltage power source pattern 66 over the whole back surface layer.

After fabricating the two-side glass epoxy board of this structure, the common cross wiring board 77 and the base board unit 67 are attached to each other thereby to complete an overriding common base board. In the process, conduction must be secured between the wiring of the base board and the connecting terminals of the ground wiring and the high voltage power source wiring around the driver IC chip mount. The process for securing this conduction includes the steps of forming through holes (i.e., the portion corresponding to the conduction through holes 62) for securing the conduction between layers after attaching the two boards, and plating the interior of the through holes for conduction.

In other words, the sixth embodiment has such a configuration that all of the first wiring pattern, the second wiring pattern, the third wiring pattern, the fourth wiring pattern and the fifth wiring pattern described above are formed on a common board of a rigid type.

In the driver IC chip described above, after being fixedly mounted on the die bonding pattern on the surface of the common board, each pad terminal and a corresponding terminal on the board surface are connected with each other by means of wire bonding.

Also in the sixth embodiment described above, the cross wiring patterns of the input unit and the output unit can be limited to the upper layer of the common board, and therefore, through holes which are to be used for a multiplicity of cross wiring are prevented from passing through the board, so that a sufficient wiring area can be secured for the ground wiring and the high voltage power source wiring arranged in the lower layer of the common board. Thus, a similar effect to the embodiments described above can be expected.

In addition, the fact that the whole board of the module for mounting the driver IC is configured of a single rigid board, can achieve reductions in both size and cost of the whole system with a simplified structure.

In the first to sixth embodiments described above, an insulating film (such as a resist film or a cover lay film) is normally deposited, though not explained, on any areas other than those requiring electrical connection of the terminals, the driver IC chip and the portions for mounting other components, etc. thereon, on the surface of the wiring boards.

The configuration according to embodiments of the present invention has been described in detail above with reference to an application to a three-electrode AC plasma display panel of surface discharge type. The spirit of the present invention, however, is of course applicable also to the AC plasma display panel of opposed electrode type (i.e., two-electrode type). Further, it is obvious that the module for mounting the driver IC according to the present invention is applicable to the EL display panel and the large-sized LCD panel exhibiting capacitive load characteristics in view of the similarity of the characteristics of the charge/discharge current flowing to the capacitance components at the time of driving.

As described above, according to a typical preferred embodiment of the present invention, there is provided a module for mounting the driver IC, comprising a first wiring unit formed with a drive voltage system wiring, a second wiring unit formed with a control system wiring for controlling the driver IC chip and a third wiring unit formed with an output terminal wiring, isolated from each other. Thus, a sufficient wiring area can be secured for the drive voltage wiring for the module for mounting the driver IC. As a result, according to the present invention, a compact module for mounting the driver IC can be fabricated, with a low line impedance of the drive voltage wiring, at low cost.

In consequence, a sufficient peak current can be supplied to the display panel, and therefore a high display brightness and stable display characteristics are attained, while realizing a display unit with a sufficient drive voltage margin and a superior display quality.

Further, the internal noise of the circuits, and electromagnetic noise, are suppressed at the time of operation of the flat display panel, thereby realizing a stable display unit having no adverse effect on the environment.

What is claimed is:

1. A module for mounting a driver IC, comprising a driver IC chip for driving the display electrodes of a flat display panel and a wiring board electrically connected with said driver IC chip, the module comprising:
    a first wiring unit formed with at least a drive power source system wiring for supplying a power source voltage to said driver IC chip for driving said flat display panel through said driver IC chip;
    a second wiring unit formed with at least a control system wiring for supplying signals to said driver IC chip for controlling said driver IC chip; and
    a third wiring unit formed with at least an output terminal wiring taken out from said driver IC chip and connected to said display electrodes of said flat display panel,
    wherein a portion of said first wiring unit, said second wiring unit and said third wiring unit are integrally disposed in a vicinity of said driver IC chip, and said first, second and third wiring units are electrically connected with respective ones of the driver IC chip.

2. A module for mounting the driver IC according to claim 1, wherein said drive power source system wiring is formed in said first wiring unit as a wiring pattern substantially over an entire surface of the first wiring unit, and said power source voltage is directly supplied to said driver IC chip from said wiring pattern.

3. A module for mounting the driver IC according to claim 2, further comprising a plurality of connecting terminals connected to said drive power source system wiring, said control system wiring and said output terminal wiring arranged around said driver IC chip on a surface of said first, second and third wiring units, respectively, and each of said connecting terminals is connected with a corresponding pad terminal on said driver IC chip.

4. A module for mounting the driver IC according to claim 2, further comprising an input unit including a plurality of input terminals each connected to said drive power source system wiring and said first and second control system wirings.

5. A module for mounting the driver IC according to claim 2, wherein an input connector is mounted on said input unit, and the power source voltage and signals are input to each of said drive power source system wiring and said control system wiring from an external board, through said input connector.

6. A module for mounting the driver IC according to claim 1, further comprising a plurality of connecting terminals connected to said drive power source system wiring, said control system wiring and said output terminal wiring arranged around said driver IC chip on a surface of said first, second and third wiring units, respectively, and each of said connecting terminals is connected with a corresponding pad terminal on said driver IC chip.

7. A module for mounting the driver IC according to claim 6, further comprising an input unit including a plurality of input terminals each connected to sail drive power source system wiring and said first and second control system wirings.

8. A module for mounting the driver IC according to claim 6, wherein an input connector is mounted on said input unit, and the power source voltage and signals are input to each of said drive power system wiring and said control system wiring from an external board, through said input connector.

9. A module for mounting the driver IC according to claim 1, further comprising an input unit including a plurality of input terminals each connected to said drive power source system wiring and said first and second control system wirings.

10. A module for mounting the driver IC according to claim 9, wherein an input connector is mounted on said input unit, and the power source voltage and signals are input to each of said drive power system wiring and said control system wiring from an external board, through said input connector.

11. A module for mounting the driver IC according to claim 1, wherein an input connector is mounted on said input unit, and the power source voltage and various signals are input to each of said drive power source system wiring and said control system wiring from an external board, through said input connector.

12. A module for mounting the driver IC according to claim 1, wherein the module mounts a plurality of the driver ICs.

13. A module for mounting a driver IC comprising a driver IC chip for driving the display electrodes of a flat display panel and a wiring board electrically connected with said driver IC chip, the module comprising:
    a first wiring portion formed with at least a drive power source system wiring for supplying a power source voltage to said driver IC chip for driving said flat display panel, through said driver IC chip and a control system wiring for supplying signals input to said driver IC chip for controlling said driver IC chip; and a second wiring portion formed with at least an output terminal wiring for converting the sequence of the output signals output from said driver IC chip into a different sequence and connecting said signals to said flat display panel, wherein said module is formed as an integrated wiring unit including said first and second wiring protions.

14. A module for mounting the driver IC according to claim 13, wherein said driver power source system wiring is formed in said first wiring portion as a wiring pattern substantially over an entire surface of the first wiring portion, and said power source voltage is directly supplied to said driver IC chip from said wiring pattern.

15. A module for mounting the driver IC according to claim 14, wherein said drive power source system wiring formed in said first wiring portion is arranged as a first subwiring unit, and said control system wiring formed in said first wiring portion as a second subwiring unit.

16. A module for mounting the driver IC according to claim 14, further comprising an input unit including a plurality of input terminals each connected to said drive power source system wiring and said control system wiring.

17. A module for mounting the driver IC according to claim 14, wherein an input connector is mounted on said input unit, and the power source voltage and supplied signals are input to each of said drive power system wiring and said control system wiring from an external board, through said input connector.

18. A module for mounting the driver IC according to claim 13, wherein said driver power source system wiring formed in said first wiring portion is arranged as a first subwiring unit, and said control system wiring formed in said first wiring portion is arranged as a second subwiring unit.

19. A module for mounting the driver IC according to claim 18, further comprising a plurality of connecting terminals connected to said drive power source system wiring, said control system wiring and said output terminal wiring arranged around said driver IC chip on the surface of said first and second wiring portions, respectively, and each of said connecting terminals is connected with a corresponding pad terminal on said driver IC chip.

20. A module for mounting the driver IC according to claim 18, further comprising an input unit including a plurality of input terminals each connected to said drive power source system wiring and said control system wiring.

21. A module for mounting the driver IC according to claim 18, wherein an input connector is mounted on said input unit, and the power source voltage and signals are input to each of said drive power system wiring and said control system wiring from an external board, through said input connector.

22. A module for mounting the driver IC according to claim 13, further comprising a plurality of connecting terminals connected to said drive power source system wiring, said control system wiring and said output terminal wiring arranged around said driver IC chip on the surface of said first and second wiring portions, respectively, and each of said connecting terminals is connected with a corresponding pad terminal on said driver IC chip.

23. A module for mounting the driver IC according to claim 22, further comprising an input unit including a plurality of input terminals each connected to said drive power source system wiring and said control system wiring.

24. A module for mounting the driver IC according to claim 22, wherein an input connector is mounted on said input unit, and the power source voltage and signals are input to each of said drive power system wiring and said control system wiring from an external board, through said inputs connector.

25. A module for mounting the driver IC according to claim 13, further comprising a plurality of connecting terminals connected to said driver power source system wiring, said control system wiring and said output terminal wiring arranged around said driver IC chip on a surface of said first and second wiring portions, respectively, and each of said connecting terminals is connected with a corresponding pad terminal on said driver IC chip.

26. A module for mounting the driver IC according to claim 13, further comprising an input unit including a plurality of input terminals each connected to said drive power source system wiring and said control system wiring.

27. A module for mounting the driver IC according to claim 26, wherein an input connector is mounted on said input unit, and the power source voltage and supplied signals are input to each of said drive power system wiring and said control system wiring from an external board, through said input connector.

28. A module for mounting the driver IC according to claim 13, wherein an input connector is mounted on said input unit, and the power source voltage and supplied signals are input to each of said drive power system wiring and said control system wiring from an external board, through said input connector.

29. A module for mounting the driver IC according to claim 13, wherein said first wiring portion and said second wiring portion are formed in a common wiring board.

30. A module for mounting the driver IC according to claim 13, wherein the module mounts a plurality of the driver ICs.

31. A module for mounting a driver IC comprising a driver IC chip for driving display electrodes of a flat display panel and a wiring board electrically connected with said driver IC chip, the module comprising:

a first wiring portion formed with at least a drive power source system wiring for supplying a power source voltage input to said driver IC chip for driving said flat display panel through said driver IC chip and a control system wiring for supplying signals input to said driver IC chip for controlling said driver IC chip;

a second wiring portion formed with at least an output terminal wiring for converting the sequence of the output signals output from said driver IC chip into a different sequence and connecting said signals to said flat display panel;

an odd circuit driver IC group connected to the odd-numbered ones of said output terminal wiring and an even circuit driver IC group connected to the even-numbered ones of said output terminal wiring; and a first wiring portion for an odd circuit, formed with a drive power source system wiring for driving said flat display panel through said odd circuit driver IC and a control system wiring for supplying signals input to said odd circuit driver IC for controlling said driver IC chip; and a first wiring portion for an even circuit, formed with a drive power source system wiring for driving said flat display panel through said even circuit driver IC and a control system wiring for supplying signals to said even circuit driver IC for controlling said driver IC chip;

wherein said second wiring portion is so configured that the output signal of said odd circuit driver IC is led to said corresponding odd-numbered output terminal, and the output signal of said even circuit driver IC is led to said corresponding even-numbered output terminal.

32. A module for mounting the driver IC according to claim 31, wherein said drive power source system wiring and said control system wiring in said first wiring portion for odd circuit are formed as a first wiring pattern and a second wiring pattern, respectively, and wherein said drive power source system wiring and said control system wiring in said first wiring portion for even circuit are formed as a third wiring pattern and a fourth wiring pattern, respectively.

33. A module for mounting the driver IC according to claim 31, further comprising an input unit including a plurality of input terminals each connected to said drive power source system wiring and said control system wiring.

34. A module for mounting the driver IC according to claim 31, wherein input an input connector is mounted on said input unit, and the power source voltage and supplied signals are input to each of said drive power system wiring and said control system wiring from an external board, through said input connector.

35. A module for mounting the driver IC according to claim 31, wherein the module mounts a plurality of the driver ICs.

36. A module for mounting a driver IC comprising a driver IC chip for driving display electrodes of a flat display panel and a wiring board electrically connected with said driver IC chip, the module comprising:
　a first wiring portion formed with at least a drive power source system wiring for supplying a power source voltage input to said driver IC chip for driving said flat display panel, through said driver IC chip and a control system wiring for supplying signals input to said driver IC chip for controlling said driver IC chip;
　a second wiring portion formed with at least an output terminal wiring for converting the sequence of the output signals output from said driver IC chip into a different sequence and connecting said signals to said flat display panel;
　an odd circuit driver IC connected to the odd-numbered ones of said output terminal wiring and an even circuit driver IC connected to the even-numbered ones of said output terminal wiring;
　a first wiring portion for odd circuit, formed with a drive power source system wiring for driving said flat display panel through said odd an circuit driver IC and a control system wiring for supplying signals input to said odd circuit driver IC for controlling said driver IC chip; and
　a first wiring portion for an even circuit, formed with a drive power source system wiring for driving said flat display panel through said even circuit driver IC and a control system wiring for supplying signals input to said even circuit driver IC for controlling said driver IC chip;
　wherein said second wiring portion is configured so that the output signal of said odd circuit driver IC is led to said corresponding odd-numbered output terminal, and the output signal of said even circuit driver IC is led to said corresponding even-numbered output terminal;
　wherein said driver power source system wiring formed in said first wiring portion for supplying said power source voltage as a wiring pattern substantially over an entire surface of the first wiring portion, and said power source voltage is directly supplied to said driver IC chip from said wiring pattern.

37. A module for mounting the driver IC according to claim 36, wherein said drive power source system wiring and said control system wiring in said wiring first wiring portion for odd circuit are formed as a first wiring pattern and a second wiring pattern, respectively, and wherein said drive power source system wiring and said control system wiring in said first wiring portion for even circuit are formed as a third wiring pattern and a fourth wiring pattern, respectively.

38. A module for mounting the driver IC according to claim 36, wherein the module mounts a plurality of the driver ICs.

39. A module for mounting the driver IC comprising a driver IC chip for driving the display electrodes of a plasma display panel;
　a wiring board for electrically connecting said driver IC chip;
　a first wiring unit formed with at least a drive power source system wiring for supplying a power source voltage to said driver IC chip for driving said plasma display panel, through said driver IC chip;
　a second wiring unit formed with a control system wiring for supplying signals to said driver IC chip for controlling said driver IC chip; and
　a third wiring unit formed with an output terminal wiring taken out from said driver IC chip for connecting to said display electrodes of said plasma display panel,
　wherein a portion of said first wiring unit, said second wiring unit and said third wiring unit are integrally disposed in a vicinity of said driver IC chip, and said first, second and third wiring units are electrically connected with respective ones of the driver IC chip.

40. A module for mounting the driver IC according to claim 39, wherein said drive power source system and said control system wiring in said wiring first wiring portion for odd circuit are formed as a first wiring pattern and a second wiring pattern, respectively, and wherein said drive power source system wiring and said control system wiring in said first wiring portion for even circuit are formed as a third wiring pattern and a fourth wiring pattern, respectively.

41. A module for mounting the driver IC according to claim 39, wherein the module mounts a plurality of the driver ICs.

42. A module for mounting a driver IC comprising a driver IC chip for driving the display electrodes of a flat display panel and a wiring board electrically connected with said driver IC chip, the module comprising:
　a first wiring portion formed with at least a drive power source system wiring for supplying a power source voltage input to said driver IC chip for driving said flat display panel through said driver IC chip and a control system wiring for supplying signals input to said driver IC chip for controlling said driver IC chip;
　a second wiring portion formed with at least an output terminal wiring for converting the sequence of the output signals output from said driver IC chip into a different sequence and connecting said signals to said flat display panel;
　a plurality of connecting terminals connected to said drive power source system wiring, said control system wiring and said output terminal wiring arranged around said driver IC chip on the surface of said first and second wiring portions, respectively, and each of said connecting terminals is connected with a corresponding pad terminal on said driver IC chip,
　an odd circuit driver IC group connected to the odd-numbered ones of said output terminal wiring and an even circuit driver IC group connected to the even-numbered ones of said output terminal wiring;

a first wiring portion for an odd circuit, formed with a drive power source system wiring for driving said flat display panel through said odd circuit driver IC and a control system wiring for supplying signals input to said odd circuit driver IC for controlling said driver IC chip; and a first wiring portion for an even circuit, formed with a drive power source system wiring for driving said flat display panel through said even circuit driver IC and a control system wiring for supplying signals input to said even circuit driver IC for controlling said driver IC chip;

wherein said second wiring portion is configured so that the output signal of said odd circuit driver IC is led to said corresponding odd-numbered output terminal, and the output signal of said even circuit driver IC is led to said corresponding even-numbered output terminal.

43. A module for mounting the driver IC according to claim 42, wherein said drive power source system wiring and said control system wiring in said first wiring portion for odd circuit are formed as a first wiring pattern and a second wiring pattern, respectively, and wherein said drive power source system wiring and said control system wiring in said first wiring portion for even circuit are formed as a third wiring pattern and a fourth wiring pattern, respectively.

44. A module for mounting the driver IC according to claim 42, wherein the module mounts a plurality of the driver ICs.

45. A module for mounting the driver IC, comprising:

a driver IC chip for driving the display electrodes of a plasma display panel;

a wiring board for electrically connecting to said driver IC chip;

a first wiring unit formed with a drive power source system wiring for supplying a power source voltage to said driver IC chip for driving said plasma display panel, through said driver IC chip;

a second wiring unit formed with at least a control system wiring for supplying signals to said driver IC chip for controlling said driver IC chip; and a third wiring unit formed with at least an output terminal wiring taken out from said driver IC chip for connecting to said display electrodes of said plasma display panel, wherein a portion of said first wiring unit, and said second wiring unit and said third wiring unit are integrally disposed in a vicinity of said driver IC chip, and said first, second and third wiring units are electrically connected with the driver IC chip.

46. A module for mounting the driver IC according to claim 45, wherein the module mounts a plurality of the driver ICs.

47. A module for mounting a driver IC, comprising:

a driver IC chip for driving display electrodes of a display panel;

a wiring board for electrically connecting to said driver IC chip;

a first wiring portion formed with at least a drive power source system wiring for supplying a power source voltage to said driver IC chip for driving said plasma display panel, through said driver IC chip, and a control system wiring for supplying signals to said driver IC chip for controlling said driver IC chip; and a second wiring portion formed with at least an output terminal wiring for converting a sequence of arrangement of the signals output from said driver IC chip into a different sequence of arrangement and connecting to the display electrodes of said plasma display panel.

48. A module for mounting the driver IC according to claim 47, wherein the module mounts a plurality of the driver ICs.

49. A module to mount a driver IC comprising a plurality of driver IC chips to drive display electrodes of a display panel a board electrically connected with said plurality driver IC chips, the module comprising:

a first wiring unit comprising at least a first wiring to supply a power source voltage to said plurality of driver IC chips to drive said display panel through said plurality of driver IC chips;

a second wiring unit comprising at least a second and a third wiring to supply signals input to said first and second driver IC chips to control said plurality of driver IC chips, respectively; and a third wiring unit comprising at least a fourth wiring taken out from said plurality of IC chips and connected to said display electrodes of said display panel, wherein a portion of said first wiring unit, said second wiring unit and said third wiring unit are integrally disposed in a vicinity of said driver IC chips, and said first, second and third wiring units are electrically connected with respective ones of the driver IC chips.

50. A module according to claim 49, wherein said first wiring is a power soruce system wiring, said second and third wirings are control system wirings, and and said fourth wiring is an output terminal wiring.

51. A module for mounting a driver IC, comprising a driver IC chip for driving the display electrodes of a flat display panel and a wiring board electrically connected with said driver IC chip, the module comprising:

a first wiring portion formed with at least a drive power source system wiring to supply a power source voltage to said driver IC chip to drive said flat display panel through said driver IC chip;

a second wiring unit formed with at least a control sysetm wiring to supply signals to said driver IC chip to control said driver IC chip; and a third wiring unit formed with at least an output terminal wiring taken out from said driver IC chip and connected to said display electrodes of said flat display panel, wherein portions of said first wiring unit, said second wiring unit and said third wiring unit are formed in a common wiring board, and said first wiring unit, said second wiring unit and said third wiring unit are integrally disposed in a vicinity of said driver IC chip, and said first, second and third wirings are electrically connected with respective ones of the driver IC chip.

52. A module for mounting the driver IC according to claim 51, wherein the module mounts a plurality of the driver ICs.

53. A module for mounting a driver IC, comprising a driver IC chip for driving the display electrodes of a flat display panel and a wiring board electrically connected with said driver IC chip, the module comprising:

a first wiring portion formed with at least a drive power source system wiring to supply a power source voltage to said driver IC chip to drive said flat display panel through said driver IC chip;

a second wiring unit formed with at least a control system wiring to supply signals to said driver IC chip to control said driver IC chip; and a third wiring unit formed with at least an output terminal wiring taken out from said driver IC chip and connected to said display electrodes of said flat display panel, wherein two of or all of said first wiring unit, said second wiring unit and said third wiring unit are formed in a common wiring board, and said first wiring unit, said second wiring unit and said third wiring unit are integrally disposed in a vicinity of said driver IC chip, and said first, second and third wirings are electrically connected with respective ones of the driver IC chip.

* * * * *

UNITED STATES PATENT AND TRADEMARK OFFICE
CERTIFICATE OF CORRECTION

PATENT NO.     : 6,703,792 B2
DATED          : March 9, 2004
INVENTOR(S)    : Toyoshi Kawada et al.

It is certified that error appears in the above-identified patent and that said Letters Patent is hereby corrected as shown below:

Column 27,
Line 65, delete "respective ones of".

Column 28,
Line 34, change "sail" to -- said --;
Lines 39 and 49, after "voltage and" insert -- supplied --;

Column 29,
Line 2, delete ",";
Line 6, change "the" (both occurrences) to -- a --;
Line 8, after "connecting said" insert -- output --;
Line 11, change "protions" to -- portions --;
Line 52, after "voltage and" insert -- supplied --.

Column 30,
Line 3, after "voltage and" insert -- supplied --.
Line 6, change "inputs" to -- input --;
Line 48, change "the (first occurrence) to -- a -- and delete "the" (second occurrence);
Line 50, after "connecting said" insert -- output --.

Column 31,
Line 33, delete ",";
Line 37, change "the (first occurrence) to -- a -- and delete "the" (second occurrence);
Lines 41 and 43, delete "the";
Line 46, after "for" insert -- an --;
Line 48, delete "an";
Line 62, change "driver" to -- drive -- and after "wiring" insert -- is --.

Column 32,
Line 3, delete "wiring" (second occurrence);
Lines 13-32, delete the text of patent claim 39 (which corresponds to application claim 38) and substitute the text of application claim 14, as follows:
　　　　A module for mounting a driver IC comprising a driver IC chip for driving display electrodes of a flat display panel and a wiring board electrically connected with said driver IC chip, the module comprising:
　　　　A first wiring portion formed with at least a drive power source system wiring for supplying a power source voltage input to said driver IC chip for driving said flat display panel through said driver IC chip and a control system wiring for supplying signals input to said driver IC chip for controlling said driver IC chip;

UNITED STATES PATENT AND TRADEMARK OFFICE
CERTIFICATE OF CORRECTION

PATENT NO. : 6,703,792 B2
DATED : March 9, 2004
INVENTOR(S) : Toyoshi Kawada et al.

It is certified that error appears in the above-identified patent and that said Letters Patent is hereby corrected as shown below:

a second wiring portion formed with at least an output terminal wiring for converting a sequence of output signals output from said driver IC chip into a different sequence and connecting said output signals to said flat display panel;
    an odd circuit driver IC connected to odd-numbered ones of said output terminal wiring and an even circuit driver IC connected to even-numbered ones of said output terminal wiring;
    a first wiring portion for an odd circuit, formed with a drive power source system wiring for driving said flat display panel through said odd circuit driver IC and a control system wiring for supplying signals input to said odd circuit driver IC for controlling said driver IC chip; and
    a first wiring portion for an even circuit, formed with a drive power source system wiring for driving said flat display panel through said even circuit driver IC and a control system wiring for supplying signals input to said even circuit driver IC for controlling said driver IC chip;
    wherein said second wiring portion is configured so that the output signal of said odd circuit driver IC is led to said corresponding odd numbered output terminal, and the output signal of said even circuit driver IC is led to said corresponding even numbered output terminal;
    wherein said drive power source system wiring formed in said first wiring portion for supplying said power source voltage is arranged as a first subwiring unit, and said control system wiring formed in said first wiring portion is arranged as a second subwiring unit.

Column 32,
Line 55, change "the" (first occurrence) to -- a -- and delete "the" (second occurrence);
Line 62, change "the" to -- a --.

Column 33,
Line 31, change "the" to -- a --;
Line 32, delete "the";
Line 37, after after "with" insert -- at least --.

UNITED STATES PATENT AND TRADEMARK OFFICE
CERTIFICATE OF CORRECTION

PATENT NO. : 6,703,792 B2
DATED : March 9, 2004
INVENTOR(S) : Toyoshi Kawada et al.

It is certified that error appears in the above-identified patent and that said Letters Patent is hereby corrected as shown below:

Column 34,
Line 12, after "panel" insert -- and -- and after "plurality" insert -- of --;
Line 33, change "soruce" to -- source --;
Line 40, change "portion" to -- unit --;

Column 35,
Line 1, change "portion" to -- unit --.

Signed and Sealed this

Tenth Day of August, 2004

JON W. DUDAS
*Acting Director of the United States Patent and Trademark Office*